US009230640B2

(12) United States Patent
Ueda et al.

(10) Patent No.: US 9,230,640 B2
(45) Date of Patent: Jan. 5, 2016

(54) GROUND CIRCUITRY FOR SEMICONDUCTOR MEMORY DEVICE

(71) Applicant: PANASONIC CORPORATION, Osaka (JP)

(72) Inventors: Takanori Ueda, Osaka (JP); Kazuyuki Kouno, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/099,314

(22) Filed: Dec. 6, 2013

(65) Prior Publication Data

US 2014/0092665 A1 Apr. 3, 2014

Related U.S. Application Data

(63) Continuation of application No. PCT/JP2012/003207, filed on May 16, 2012.

(30) Foreign Application Priority Data

Jul. 6, 2011 (JP) .................................. 2011-149700

(51) Int. Cl.
*G11C 13/00* (2006.01)
*H01L 27/02* (2006.01)
*H01L 27/10* (2006.01)

(52) U.S. Cl.
CPC ........ *G11C 13/0002* (2013.01); *G11C 13/0028* (2013.01); *G11C 13/0069* (2013.01);
(Continued)

(58) Field of Classification Search
CPC ........... G11C 13/0002; G11C 13/0069; G11C 13/0028; G11C 2013/0071; G11C 2213/82; H01L 27/0207; H01L 27/101

USPC .................................... 365/63, 148, 189.05
See application file for complete search history.

(56) References Cited

U.S. PATENT DOCUMENTS 5,062,079 A * 10/1991 Tsuchida et al. .............. 365/205
6,069,824 A 5/2000 Kojima et al.
(Continued)

FOREIGN PATENT DOCUMENTS

JP 10-064292 A 3/1998
JP 10-162587 A 6/1998
(Continued)

OTHER PUBLICATIONS

International Search Report issued in International Application No. PCT/JP2012/003207 with Date of mailing Jun. 19, 2012, with English Translation.
(Continued)

*Primary Examiner* — Shawki S Ismail
*Assistant Examiner* — Muhammad S Islam
(74) *Attorney, Agent, or Firm* — McDermott Will & Emery LLP

(57) ABSTRACT

A memory cell array includes a plurality of word lines each connected to gates of cell transistors in corresponding ones of a plurality of memory cells, a plurality of first control lines, a plurality of second control lines, a first ground circuit configured to ground the first control lines together in accordance with a first signal, and the first ground circuit includes a plurality of first transistors provided in a one-to-one correspondence with the first control lines, and each including a drain connected to a corresponding one of the first control lines, a first ground line configured to ground sources of the first transistors together, and a first signal line connected to gates of the first transistors to feed the first signal to the gates.

17 Claims, 18 Drawing Sheets

(52) U.S. Cl.
CPC .......... *H01L27/0207* (2013.01); *H01L 27/101* (2013.01); *G11C 2013/0071* (2013.01); *G11C 2213/82* (2013.01)

(56) References Cited

U.S. PATENT DOCUMENTS

| | | | | |
|---|---|---|---|---|
| 7,280,384 | B2 * | 10/2007 | Suzuki | 365/145 |
| 2003/0007389 | A1 | 1/2003 | Ohtani et al. | |
| 2007/0285974 | A1 | 12/2007 | Takemura et al. | |

FOREIGN PATENT DOCUMENTS

| | | |
|---|---|---|
| JP | 2002-343091 A | 11/2002 |
| JP | 2006-185557 A | 7/2006 |
| JP | 2010-027178 A | 2/2010 |
| WO | 2010-125852 A1 | 11/2010 |

OTHER PUBLICATIONS

Chinese Search Report issued in Chinese Application No. 201280024658.5 dated May 11, 2015, with English Translation.

* cited by examiner

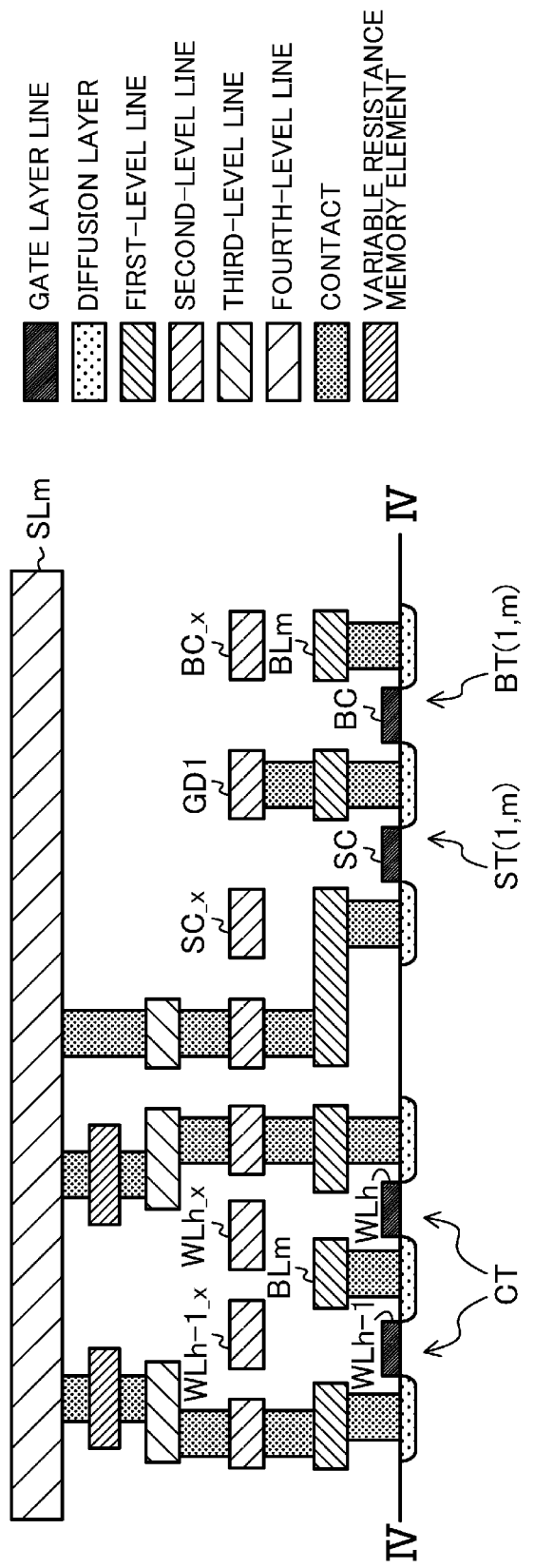

GROUND CIRCUITRY FOR SEMICONDUCTOR MEMORY DEVICE

CROSS-REFERENCE TO RELATED APPLICATIONS

This is a continuation of International Application No. PCT/JP2012/003207 filed on May 16, 2012, which claims priority to Japanese Patent Application No. 2011-149700 filed on Jul. 6, 2011. The entire disclosures of these applications are incorporated by reference herein.

BACKGROUND

The present disclosure relates to semiconductor memory devices, and more particularly to a nonvolatile semiconductor memory device including a variable resistance memory element, for example.

Semiconductor memory devices include volatile memories that require a power supply to retain data, and nonvolatile memories that do not require a power supply. Examples of nonvolatile memories include flash memories, and resistive random access memories (ReRAMs) that have recently been being developed. Predominant nonvolatile memories are currently flash memories, and in a flash memory, the time during which data are rewritten is in the order of microseconds or milliseconds, and a rewrite operation is performed by using a voltage higher than or equal to 10 V. In contrast, in a ReRAM including a variable resistance memory element, the time during which data are rewritten is in the order of nanoseconds, and a rewrite operation can be performed by using a voltage of about 1.8 V. Thus, the ReRAM allows the speed of the rewrite operation to be higher than the flash memory, and allows the power consumed by the rewrite operation to be lower than the flash memory.

Examples of memory cells of the ReRAM include 1T1R-type memory cells illustrated in FIG. 17A, and cross-point memory cells illustrated in FIG. 17B. The 1T1R-type memory cells illustrated in FIG. 17A include unipolar memory cells and bipolar memory cells. Pulses of the same polarity are applied to a unipolar memory cell both to write data into a variable resistance memory element and to erase data from the variable resistance memory element. For example, as illustrated in FIG. 18A, a source line is fixed at the ground potential, a rewrite pulse is applied through a bit line to a unipolar memory cell, and the applied voltage is adjusted to write data into the memory cell, or erase data from the memory cell.

In contrast, the polarity of a pulse applied to a bipolar memory cell to write data into a variable resistance memory element is opposite to that of a pulse applied thereto to erase data from the variable resistance memory element. For example, as illustrated in FIG. 18B, to write data into a bipolar memory cell, a bit line is fixed at the ground potential, and a pulse is applied through a source line to the memory cell. To erase data from the bipolar memory cell, the source line is fixed at the ground potential, and a pulse is applied through the bit line to the memory cell. As such, the direction of the pulse applied to the memory cell and the applied voltage are controlled to write data into the memory cell, or erase data from the memory cell.

When voltages are applied to memory cells to write data into the memory cells or erase data from the memory cells, equal voltages need to be applied to the memory cells independently of the locations of the memory cells in a memory cell array. Thus, bit lines have conventionally been grounded through a discharge circuit outside a memory cell array to apply voltages to memory cells (see, for example, Japanese Unexamined Patent Publication No. H10-064292).

SUMMARY

Bit lines and source lines each have an interconnect resistance and an interconnect capacitance, and the interconnect resistance and the interconnect capacitance increase with increasing length of the line. When bit lines are grounded outside a memory cell array as described in Japanese Unexamined Patent Publication No. H10-064292, portions of the bit lines near the points at which the bit lines are grounded can be fixed at approximately the ground potential. However, the interconnect resistance and the interconnect capacitance of each of portions of the bit lines far from the points at which the bit lines are grounded increase. Thus, the potentials of the bit lines may be slightly higher than the ground potential. As a result, the voltage actually applied to a memory cell may vary depending on the location of the memory cell in the memory cell array.

In contrast, a configuration in which a memory cell array includes transistors each configured to ground a source line has been proposed (see, for example, U.S. Pat. No. 6,069,824). However, a target semiconductor memory device for the technique described in U.S. Pat. No. 6,069,824 corresponds to a flash memory, and the configuration of a memory cell of a flash memory is different from that of a memory cell of a ReRAM. Furthermore, U.S. Pat. No. 6,069,824 is silent about how to control a ground transistor.

To address the problem, a semiconductor memory device according to the present disclosure allows the potential of a grounded line connected to a memory cell to be closer to the ground potential.

In an example semiconductor memory device including: a memory cell array including a plurality of memory cells that are arranged in a matrix, and each include a memory element and a cell transistor both connected between a corresponding one of a plurality of first control lines and a corresponding one of a plurality of second control lines, the memory cell array includes a plurality of word lines being in a one-to-one correspondence with rows, each connected to gates of the cell transistors in the memory cells located on a corresponding one of the rows, and extending along the rows, the first control lines, the second control lines, at least one first ground circuit configured to ground the first control lines together in accordance with a received first signal, and at least one second ground circuit configured to ground the second control lines together in accordance with a received second signal. The first ground circuit includes a plurality of first transistors provided in a one-to-one correspondence with the first control lines, and each including a drain connected to a corresponding one of the first control lines, a first ground line configured to ground sources of the first transistors together, and a first signal line connected to gates of the first transistors to feed the first signal to the gates, and the second ground circuit includes a plurality of second transistors provided in a one-to-one correspondence with the second control lines, and each including a drain connected to a corresponding one of the second control lines, a second ground line configured to ground sources of the second transistors together, and a second signal line connected to gates of the second transistors to feed the second signal to the gates.

With this configuration, the memory cell array including the memory cells that each include the memory element and the cell transistor includes the at least one first ground circuit configured to ground the first control lines, such as bit lines, together in accordance with the first signal. The first ground circuit includes the first transistors each including the drain connected to a corresponding one of the first control lines, and the grounded source. The first signal is fed through the first signal line to the first transistors to allow the first transistors to be conductive, and the first control lines provided in a one-to-one correspondence with the first transistors are grounded together. Thus, the first control lines are grounded at locations relatively close to themselves, thereby allowing the potentials of the first control lines to be closer to the ground potential. In other words, independently of the locations of the memory cells in the memory cell array, equal voltages can be applied to the memory cells.

The second ground circuit includes the second transistors each including the drain connected to a corresponding one of the second control lines, and the grounded source. The second signal is fed through the second signal line to the second transistors to allow the second transistors to be conductive, and the second control lines, such as source lines, provided in a one-to-one correspondence with the second transistors are grounded together. This allows the potentials of the second control lines to be closer to the ground potential similarly to the first control lines.

A gate width and a gate length of each of the first and second transistors are preferably equal to a gate width and a gate length, respectively, of the cell transistor included in each of the memory cells.

With this configuration, the transistors in the first and second ground circuits and the cell transistors in the memory cells can be similarly formed, thereby providing a uniform layout of features in the memory cell array. In other words, the first and second ground circuits can be provided without degrading the characteristics of the memory cells due to the impairment of the uniformity of the layout of features.

BRIEF DESCRIPTION OF THE DRAWINGS

FIG. 16 is a cross-sectional view of an example semiconductor memory device having a four-level interconnection structure.

DETAILED DESCRIPTION

First Embodiment

Figure 1:
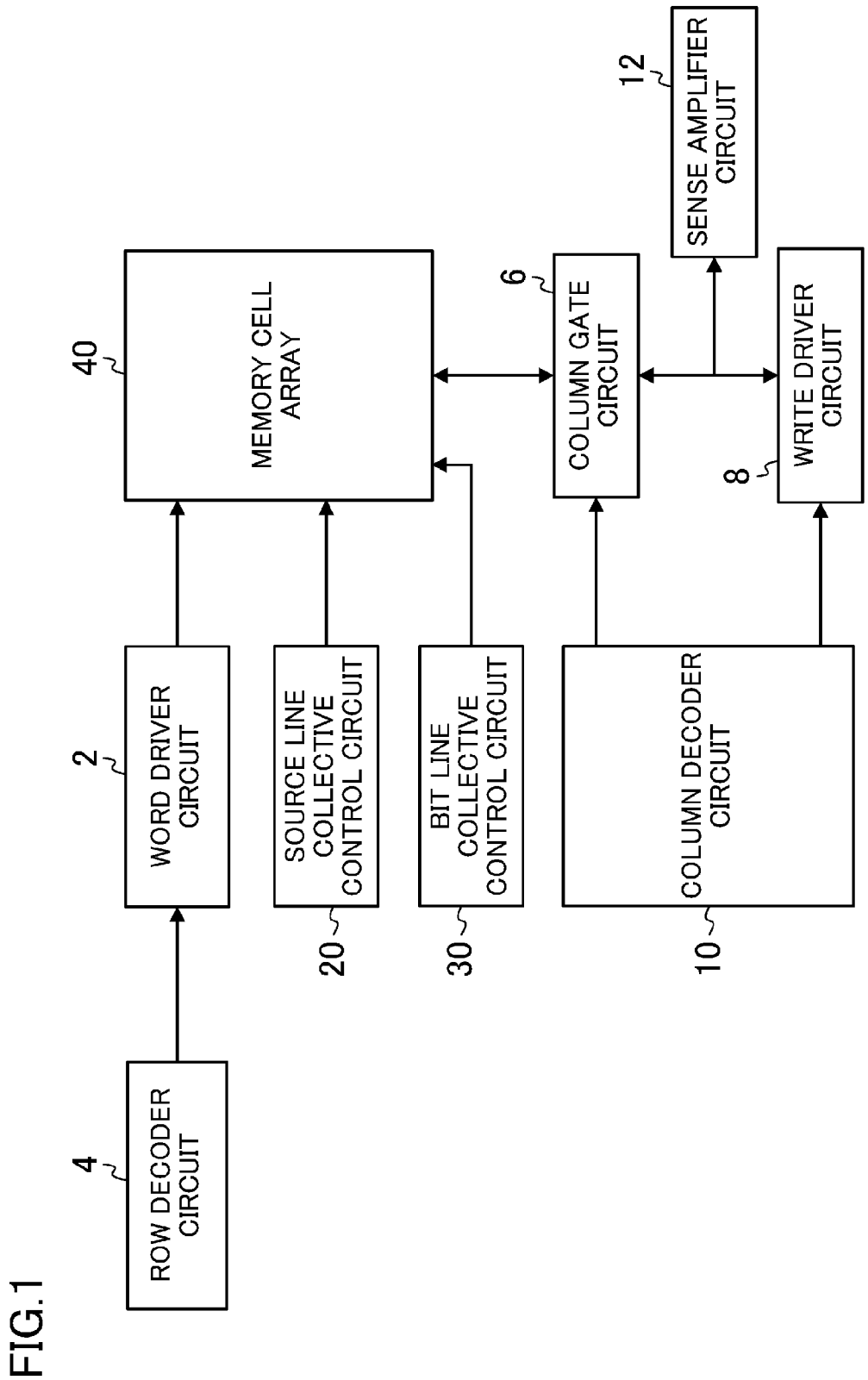
FIG. 1 is a block diagram of a semiconductor memory device according to a first embodiment.

FIG. 1 is a block diagram of a semiconductor memory device according to a first embodiment. The semiconductor memory device is, for example, a variable resistance nonvolatile memory device, and includes a word driver circuit 2, a row decoder circuit 4, a column gate circuit 6, a write driver circuit 8, a column decoder circuit 10, a sense amplifier circuit 12, a source line collective control circuit 20, a bit line collective control circuit 30, and a memory cell array 40 including a plurality of memory cells.

The row decoder circuit 4 controls the word driver circuit 2 such that the word driver circuit 2 selects one of word lines identified by a received address signal. The word driver circuit 2 selects the one of the word lines according to the output of the row decoder circuit 4 to drive the selected word line.

The column gate circuit 6 and the write driver circuit 8 are controlled according to the output of the column decoder circuit 10. The column gate circuit 6 selects one of the bit lines and one of the source lines identified by an address signal received by the column decoder circuit 10, and connects the selected bit line and the selected source line to the write driver circuit 8 and the sense amplifier circuit 12. A voltage is applied through the write driver circuit 8 to the bit line and the source line that have been selected by the column gate circuit 6. The sense amplifier circuit 12 determines whether data read from one of the memory cells in the memory cell array 40 indicates "1" or "0."

The source line collective control circuit 20 outputs a signal for grounding the source lines together. The bit line collective control circuit 30 outputs a signal for grounding the bit lines together.

Figure 2:
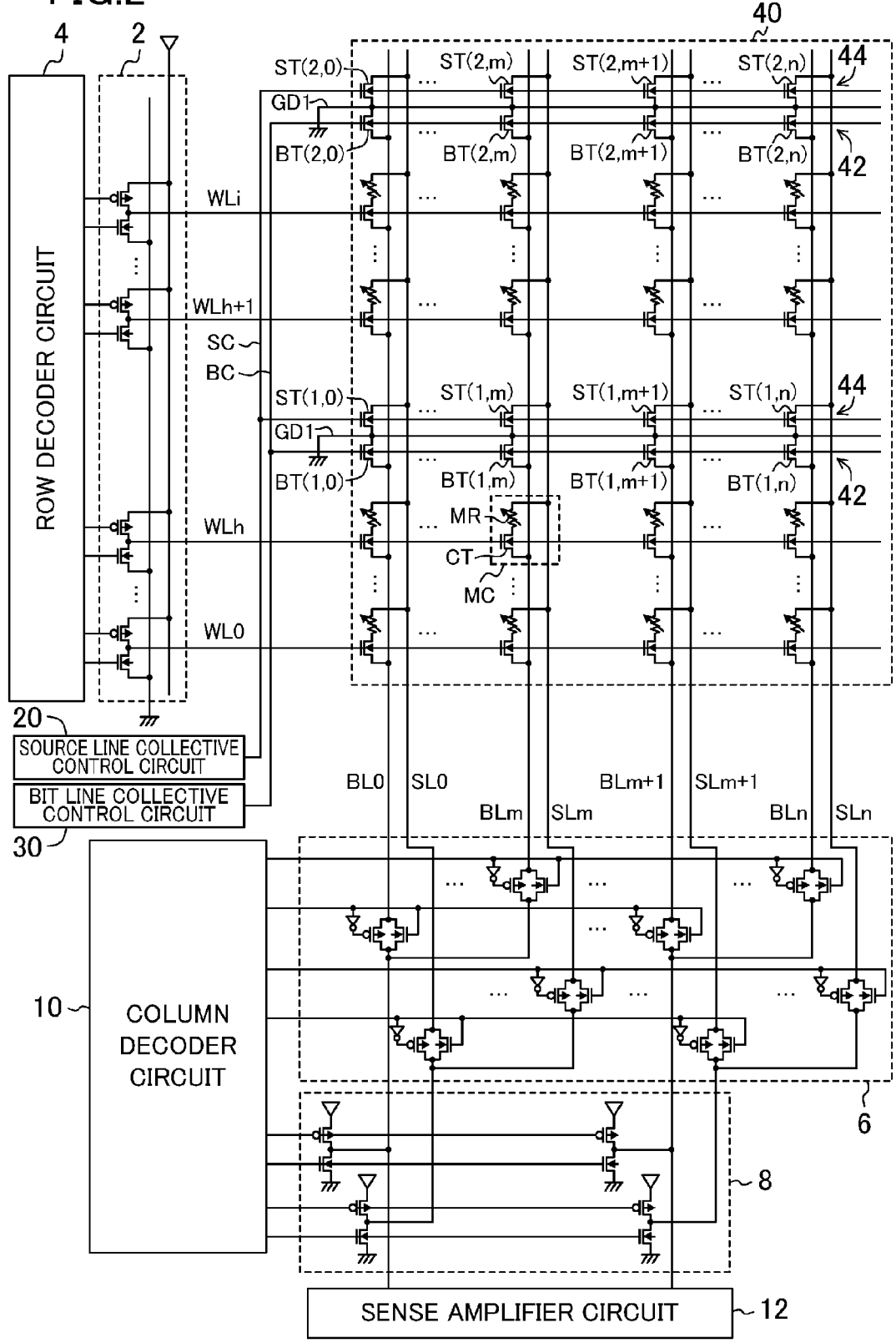
FIG. 2 is a circuit diagram of the semiconductor memory device according to the first embodiment.

FIG. 2 is a circuit diagram illustrating the memory cell array 40 and its surrounding circuits. In FIG. 2, the configurations of circuits except the memory cell array 40, the source line collective control circuit 20, and the bit line collective control circuit 30 are similar to those of equivalent circuits for use in a typical semiconductor memory device, and thus, are not described.

The memory cell array 40 includes a plurality of memory cells MC arranged in a matrix, a plurality of word lines WL0-WLi (abbreviated as WL if necessary), a plurality of bit lines BL0-BLn (abbreviated as BL if necessary), a plurality of source lines SL0-SLn (abbreviated as SL if necessary), first ground circuits 42 collectively connecting the bit lines BL to the ground according to the output of the bit line collective control circuit 30, and second ground circuits 44 collectively connecting the source lines SL to the ground according to the output of the source line collective control circuit 20. In this embodiment, the bit lines BL are first control lines, and the source lines SL are second control lines. In FIG. 2, the characters m and n represent natural numbers satisfying n=2m, and the characters h and i represent natural numbers satisfying i=2h.

The memory cells MC are, for example, 1T1R-type memory cells, and each include a variable resistance memory element MR and a cell transistor CT both connected between a corresponding one of the bit lines BL and a corresponding one of the source lines SL. For example, in the memory cell MC illustrated by the broken line in FIG. 2, one end of the variable resistance memory element MR is connected to the corresponding source line SLm, and the other end thereof is connected to a source of the cell transistor CT. A drain of the cell transistor CT is connected to the corresponding bit line BLm.

The word lines WL0-WLi are in a one-to-one correspondence with rows of the memory cell array 40, and extend along the rows. The word lines WL0-WLi are each connected to gates of the cell transistors CT included in the memory cells MC on a corresponding one of the rows.

The bit lines BL0-BLn are in a one-to-one correspondence with columns of the memory cell array 40, extend along the columns, and are each connected to drains of the cell transistors CT included in the memory cells MC in a corresponding one of the columns.

The source lines SL0-SLn are in a one-to-one correspondence with the columns of the memory cell array 40, extend along the columns, and are each connected to the variable resistance memory elements MR included in the memory cells MC in a corresponding one of the columns.

One of the first ground circuits 42 includes a plurality of first transistors BT(1, 0)-BT(1, n) (abbreviated as BT if necessary), a first ground line GD1, and a bit line collective control line BC corresponding to a first signal line. In the memory cell array 40, the first ground line GD1 and the bit line collective control line BC are parallel to each other. Another one of the first ground circuits 42, which includes a plurality of first transistors BT(2, 0)-BT(2, n), another first ground line GD1, and the bit line collective control line BC, is illustrated in the memory cell array 40 in FIG. 2. The two first ground circuits 42 have a similar configuration; thus, the configuration of the former one of the two first ground circuits 42 will be described.

The transistors BT(1, 0)-BT(1, n) correspond to bit lines BL0-BLn, respectively, and are aligned along a corresponding one of the rows. Drains of the transistors BT are each connected to a corresponding one of the bit lines BL. Sources of the transistors BT are all connected to a corresponding one of the ground lines GD1. One end of the corresponding one of the ground lines GD1 is connected to the ground.

The bit line collective control line BC is connected to all of gates of the transistors BT, and is connected to the bit line collective control circuit 30. Thus, a signal (a first signal) configured to turn the transistors BT on is fed from the bit line collective control circuit 30 through the bit line collective control line BC to the gates of the transistors BT. This allows the transistors BT to be turned on, and the bit lines BL are grounded together.

One of the second ground circuits 44 includes a plurality of second transistors ST(1, 0)-ST(1, n) (abbreviated as ST if necessary), a corresponding one of the first ground lines GD1, and a source line collective control line SC corresponding to a second signal line. In the memory cell array 40, the corresponding one of the ground lines GD1 and the source line collective control line SC are parallel to each other. While, in this embodiment, a pair of the first ground circuit 42 and the second ground circuit 44 share the corresponding one of the first ground lines GD1, the pair of the first and second ground circuits 42 and 44 may include different ground lines. Another one of the second ground circuits 44, which includes second transistors ST(2, 0)-ST(2, n), a corresponding one of the first ground lines GD1, and the source line collective control line SC, is illustrated in the memory cell array 40 in FIG. 2. The two second ground circuits 44 have a similar configuration; thus, the configuration of the former one of the two second ground circuits 42 will be described.

The transistors ST(1, 0)-ST(1, n) correspond to source lines SL0-SLn, respectively, and are aligned along a corresponding one of the rows. Drains of the transistors ST are each connected to a corresponding one of the source lines SL. Sources of the transistors ST are all connected to the ground line GD1.

The source line collective control line SC is connected to all of gates of the transistors ST, and is connected to the source line collective control circuit 20. Thus, a signal (a second signal) configured to turn the transistors ST on is fed from the source line collective control circuit 20 through the source line collective control line SC to the gates of the transistors ST. This allows the transistors ST to be turned on, and the source lines SL are grounded together.

Next, operations for reading data from the semiconductor memory device illustrated in FIG. 2, writing data therein, and erasing data therefrom will be described.

First, a case where data are read from a memory cell will be described. Assume that a memory cell MC from which data are to be read is a memory cell MC connected to the bit line BLm, the source line SLm, and the word line WLh (hereinafter referred to as the "selected memory cell MC").

The column gate circuit 6 selects the source line SLm from among the source lines SL0-SLn. The selected source line SLm is grounded in the write driver circuit 8. The word lines WL0-WLi are grounded by the word driver circuit 2.

Here, the source line SLm is routed from the ground point at which the source line SLm is grounded in the write driver circuit 8 to the junction point between the variable resistance memory element MR of the selected memory cell MC and the source line SLm over a long distance. Thus, the interconnect resistance and the interconnect capacitance of the source line SLm may cause the potential of a portion of the source line SLm in the selected memory cell MC to be slightly higher than the ground potential. In other words, although the source line SLm is grounded, the potential of the portion of the source line SLm in the selected memory cell MC may be higher than the ground potential.

To address this problem, a signal at the H level, for example, is output, as a signal configured to turn the transistors ST on, from the source line collective control circuit 20 to the source line collective control line SC. Thus, the transistors ST(1, 0)-ST(1, n) and the transistors ST(2, 0)-ST(2, n) are all selected so as to be turned on, and the source lines SL are grounded through the ground lines GD1. The provision of the transistors ST in the memory cell array 40 as above can reduce the distance over which the source lines SL are each routed from a corresponding one of the memory cells MC to the ground. In other words, the interconnect resistance and the interconnect capacitance of a portion of each of the source lines SL from the ground to a corresponding one of the memory cells are reduced, thereby preventing the potential of the source line SL from being slightly higher than the ground potential.

The sense amplifier circuit 12 precharges the bit line BLm to a potential for reading data with the source line SLm grounded. Furthermore, a voltage is applied to the word line WLh, and power is discharged from the bit line BLm to the source line SLm. The variable resistance memory element MR is of either high resistance or low resistance, and the speed at which power is discharged from the bit line BLm to the source line SLm varies depending on the resistance of the variable resistance memory element MR. Thus, the sense amplifier circuit 12 determines the potential of the bit line BLm, which shows the resistance of the variable resistance memory element MR, after a fixed time period, thereby determining whether the variable resistance memory element MR is of high resistance or of low resistance. This determination shows data stored in the selected memory cell MC.

Next, operations in which the bit line BLm is grounded, and then, a pulse is applied to the source line SLm will be described as operations for writing data into the selected memory cell MC.

The bit line BLm and the source line SLm pass through the column gate circuit 6, and are grounded in the write driver circuit 8. The word driver circuit 2 grounds the word lines WL0-WLi.

Here, the bit line BLm is routed from the ground point at which the bit line BLm is grounded in the write driver circuit 8 to the junction point between the cell transistor CT and the bit line BLm over a long distance. Thus, although the bit line BLm is grounded by the write driver circuit 8, the interconnect resistance and the interconnect capacitance of the bit line BLm may cause the potential of a portion of the bit line BLm in the selected memory cell MC to be slightly higher than the ground potential. In particular, with increasing distance from the ground point, the potential is significantly higher than the ground potential.

To address this problem, a signal at the H level, for example, is output, as a signal configured to turn the transistors BT on, from the bit line collective control circuit 30 to the bit line collective control line BC. Thus, the transistors BT(1, 0)-BT(1, n) and the transistors BT(2, 0)-BT(2, n) are all selected so as to be turned on, and the bit lines BL are grounded through the ground lines GD1. The provision of the transistors BT in the memory cell array 40 as above can reduce the distance over which the bit lines BL are each routed from a corresponding one of the memory cells MC to the ground. In other words, the interconnect resistance and the interconnect capacitance of a portion of each of the bit lines BL from the ground to the corresponding one of the memory cells are reduced, thereby preventing the potential of the bit line BL from being slightly higher than the ground potential.

Then, a voltage is applied to the word line WLh, and a pulse is applied from the write driver circuit 8 to the source line SLm. Thus, a desired voltage pulse can be applied to the selected memory cell MC. In other words, independently of the locations of the memory cells MC in the memory cell array 40, equal voltages can be actually applied to the memory cells MC. Also when voltages are previously applied to the word line WLh and the source line SLm, and then, a pulse is applied to the bit line BLm, similar advantages can be obtained.

Subsequently, operations in which the source line SLm is grounded, and then, a pulse is applied to the bit line BLm will be described as operations for erasing data from the selected memory cell MC.

The bit line BLm and the source line SLm pass through the column gate circuit 6, and are grounded in the write driver circuit 8. The word driver circuit 2 grounds the word lines WL0-WLi.

Here, the source line SLm is routed from the ground point at which the source line SLm is grounded in the write driver circuit 8 to the junction point between the cell transistor CT and the source line SLm over a long distance. Thus, although the source line SLm is grounded, the interconnect resistance and the interconnect capacitance of the source line SLm may cause the potential of a portion of the source line SLm in the selected memory cell MC to be slightly higher than the ground potential.

To address this problem, a signal at the H level, for example, is output from the source line collective control circuit 20 to the source line collective control line SC. Thus, the transistors ST(1, 0)-ST(1, n) and the transistors ST(2, 0)-ST(2, n) are all selected so as to be turned on, and the source lines SL are grounded through the ground lines GD1. The provision of the transistors ST in the memory cell array 40 as above can reduce the distance over which the source lines SL are each routed from a corresponding one of the memory cells MC to the ground. In other words, the potentials of the source lines SL can be closer to the ground potential.

Then, a voltage is applied to the word line WLh, and a pulse is applied from the write driver circuit 8 to the bit line BLm. Thus, a desired voltage pulse can be applied to the selected memory cell MC. In other words, independently of the locations of the memory cells MC in the memory cell array 40, equal voltages can be actually applied to the memory cells MC. Also when voltages are previously applied to the word line WLh and the bit line BLm, and then, a pulse is applied to the source line SLm, similar advantages can be obtained.

Figure 3:
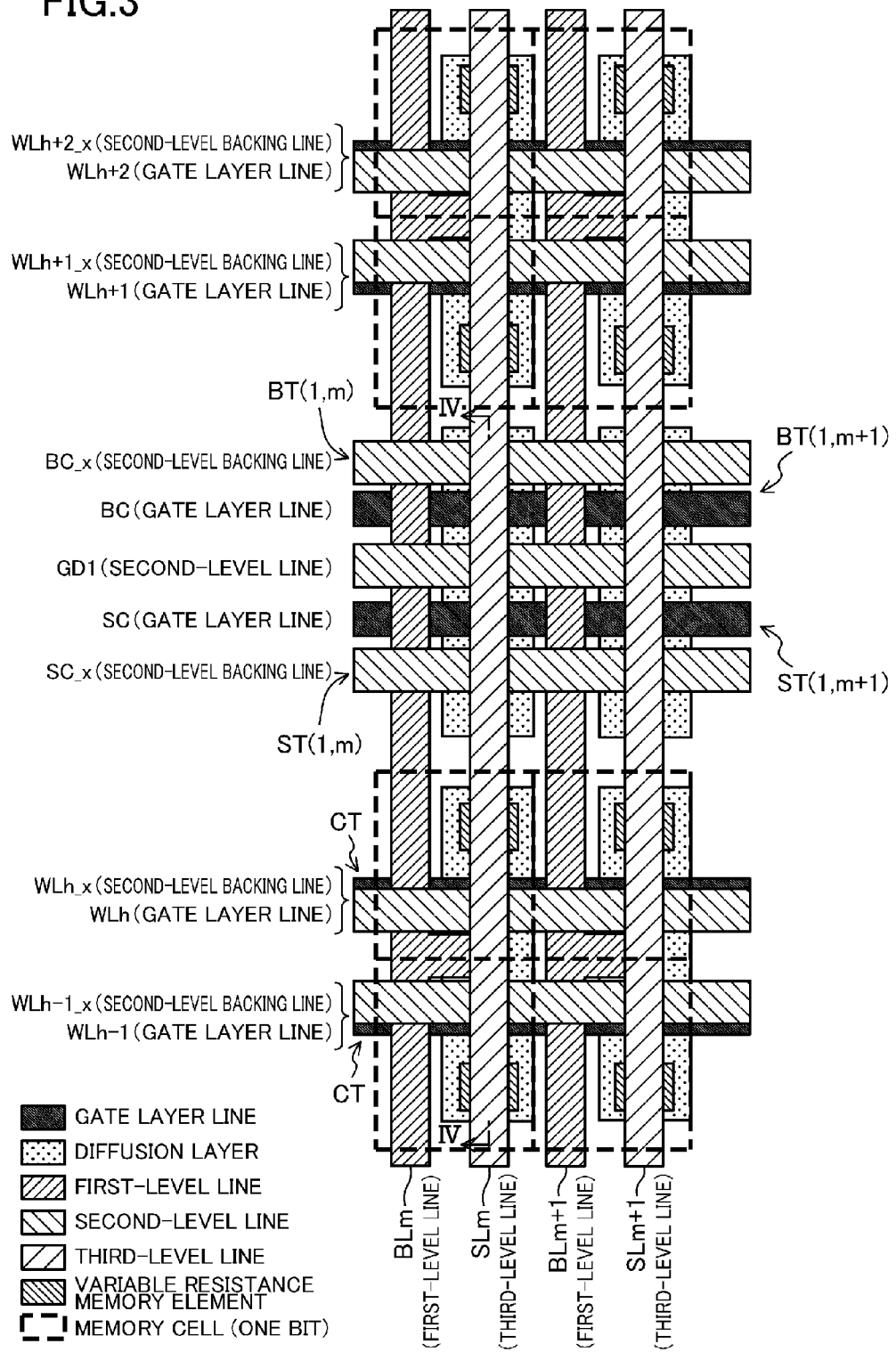
FIG. 3 illustrates a layout of a portion of the semiconductor memory device in FIG. 2.

FIG. 3 illustrates the layout of a region surrounding the bit line BLm and the source line SLm illustrated in FIG. 2. In this embodiment, a case in which the memory cell array 40 has a three-level interconnection structure will be exemplified. In FIG. 3, regions surrounded by the broken lines each illustrate a one-bit memory cell.

The bit line collective control line BC and the source line collective control line SC are made of a material identical with a material of gate layer lines corresponding to the gates of the cell transistors CT. Furthermore, the memory cell array 40 includes backing lines for the word lines WL, the bit line collective control line BC, and the source line collective control line SC. For example, WLh_x represents a backing line for the word line WLh. Furthermore, BC_x represents a backing line for the bit line collective control line BC, and SC_x represents a backing line for the source line collective control line SC. The layout relationship among the word lines WL, the bit line collective control line BC, the source line collective control line SC, and the backing lines for the lines WL, BC, and SC is determined by a process rule.

Figure 4:
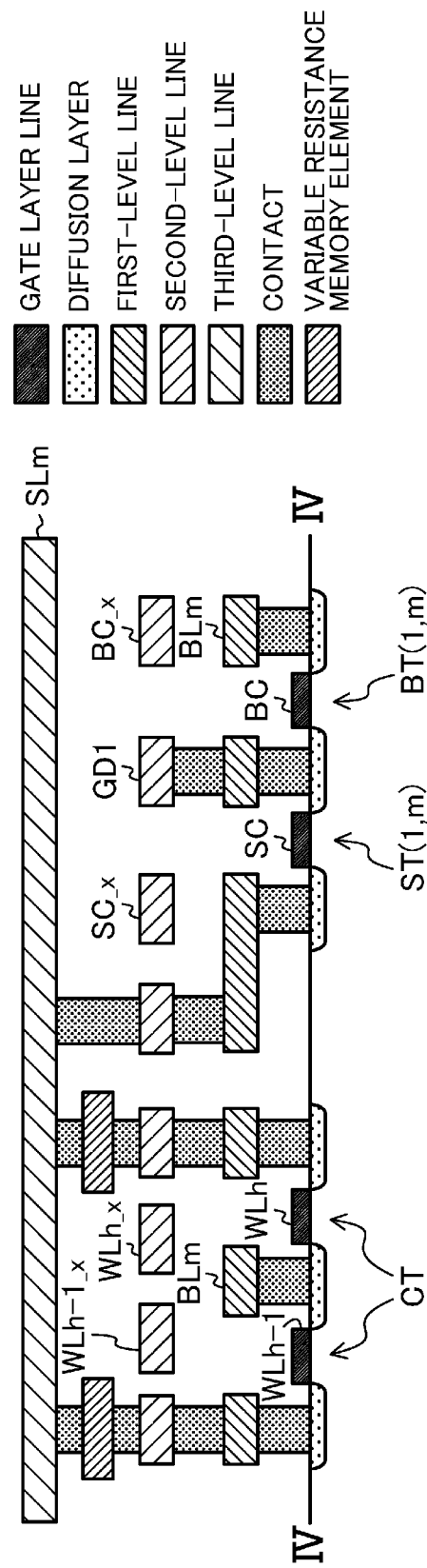
FIG. 4 is a cross-sectional view taken along the line IV-IV in the layout of FIG. 3.

FIG. 4 is a cross-sectional view taken along the line IV-IV in FIG. 3. FIG. 4 illustrates contacts omitted in FIG. 3. As illustrated in FIG. 4, the memory cell array 40 can have a three-level interconnection structure. The cell transistor CT included in each of the memory cells includes diffusion layers formed in the surface of a substrate, and a corresponding one of word lines serving as a gate. The variable resistance memory element is provided between a second-level line and a third-level line, and have upper and lower terminals. The upper terminal is connected through a corresponding one of the contacts to the source line SLm that is the third-level line, and the lower terminal is connected through a first-level line, the second-level line, and corresponding ones of the contacts to a source of the cell transistor CT. A drain of the cell transistor CT is connected through a corresponding one of the contacts to the bit line BLm that is a first-level line.

The word lines correspond to two lines such as a gate layer line WLh and a second-level line WLh_x that is a backing line for the gate layer line WLh. The two lines are connected together at, for example, a plurality of locations in the memory cell array 40, and the distance between each adjacent pair of the locations at which the two lines are connected together is fixed.

The transistor BT(1, m) includes diffusion layers, and one of bit line collective control lines serving as a gate. The bit line collective control lines correspond to two lines such as a gate layer line BC and a second-level line BC_x that is a backing line for the gate layer line BC. The two lines are connected together at, for example, a plurality of locations in the memory cell array 40, and the distance between each adjacent pair of the locations at which the two lines are connected together is fixed. A source of the transistor BT(1, m) is connected through corresponding ones of the contacts and a first-level line to a first ground line GD1 that is a second-level line, and a drain thereof is connected through a corresponding one of the contacts to the bit line BLm.

The transistor ST(1, m) includes diffusion layers, and one of source line collective control lines serving as a gate. The source line collective control lines correspond to two lines such as a gate layer line SC and a second-level line SC_x that is a backing line for the gate layer line SC. The two lines are connected together at, for example, a plurality of locations in the memory cell array 40, and the distance between each adjacent pair of the locations at which the two lines are connected together is fixed. A source of the transistor ST(1, m) is connected through corresponding ones of the contacts and the first-level line to the first ground line GD1, and a drain thereof is connected through corresponding ones of the contacts, a first-level line, and a second-level line to the source line SLm.

As above, according to this embodiment, the first and second ground circuits 42 and 44 are provided in the memory cell array 40 to ground the bit lines BL and the source lines SL together. Thus, the distance between the ground point at which the bit lines BL and the source lines SL are grounded together by the first and second ground circuits 42 and 44 and a corresponding one of the memory cells MC is shorter than the distance between the corresponding one of the memory cells MC and a corresponding one of the ground points in the write driver circuit 8. This allows the potential of each of the grounded bit and source lines BL and SL to be closer to the ground potential. Thus, independently of the locations of the memory cells MC in the memory cell array 40, equal voltages can be actually applied to the memory cells MC. In other words, data can be more accurately written into the memory cells MC, or be more accurately erased from the memory cells MC.

The memory cell array 40 having a three-level interconnection structure allows the cost for diffusion into a wafer to be lower than the diffusion cost for a memory cell array having a four-or-more-level interconnection structure, and thus, can reduce the diffusion period.

Here, U.S. Pat. No. 6,069,824 illustrates a circuit diagram in which a memory cell array of a flash memory includes transistors for grounding source lines. In U.S. Pat. No. 6,069,824, a ground transistor typically placed outside the memory cell array is placed in the memory cell array as it is. Such a configuration may significantly impair the uniformity of the layout of features in the memory cell array due to the ground transistors in the memory cell array. As a result, the characteristics of memory cells are more likely to be degraded.

To address this problem, in this embodiment, the transistors BT in each of the first ground circuits 42 and the transistors ST in each of the second ground circuits 44 preferably have the same shape as cell transistors CT of the memory cells. For example, as illustrated in FIGS. 3 and 4, the gate length and gate width of each of the transistors BT(1, m) and ST(1, m) are identical with the gate length and gate width, respectively, of each of the cell transistors CT of the memory cells. Thus, the uniformity of the layout of features in the memory cell array 40 can be maintained as much as possible, and the preferable characteristics of the memory cells can be kept. For example, in addition to the gate length and gate width, the thickness of a gate oxide film and the shape of each of the diffusion layers of the transistors BT(1, m) and ST(1, m) may be identical with the thickness of a gate oxide film and the shape of each of the diffusion layers, respectively, of the cell transistors CT of the memory cells.

While, in this embodiment, a case where the first and second ground circuits 42 and 44 are both provided was described, either the first ground circuits 42 or the second ground circuits 44 may be provided. For example, only a single first ground circuit 42 may be placed in the memory cell array 40.

Alternatively, a single first ground circuit 42 and a single second ground circuit 44 may be placed in the memory cell array 40. The number of first ground circuits 42 placed in the memory cell array 40 may be different from that of second ground circuits 44 placed therein.

When a plurality of first ground circuits 42 and a plurality of second ground circuits 44 are placed in the memory cell array 40, the first transistors BT are arranged to be close to the second transistors ST along the columns, for example, as illustrated in FIG. 2. Pairs of first and second ground circuits 42 and 44 are spaced every predetermined number of the rows of the memory cell array 40 apart. Thus, groups each including the bit line collective control line BC, the source line collective control line SC, and the ground line GD1 are evenly spaced in the memory cell array 40. In other words, a more uniform layout of features in the memory cell array 40 can be provided, and the first and second ground circuits 42 and 44 allow all of the bit lines BL and the source lines SL to be at substantially the same potential closer to the ground potential.

When a pulse is applied to a selected one of the bit lines BL, and in this situation, the selected one of the bit lines BL is to be discharged, a signal at the H level, for example, may be output from the bit line collective control circuit 30 to the bit line collective control line BC. This allows the transistors BT to be conductive, and thus, can increase the speed at which the bit line BL is discharged. Similarly, when a pulse is applied to a selected one of the source lines SL, and in this situation, the selected one of the source lines SL is to be discharged, a signal at the H level, for example, may be output from the source line collective control circuit 20 to the source line collective control line SC. This allows the transistors ST to be conductive, and thus, can increase the speed at which the source line SL is discharged.

Second Embodiment

Figure 5:
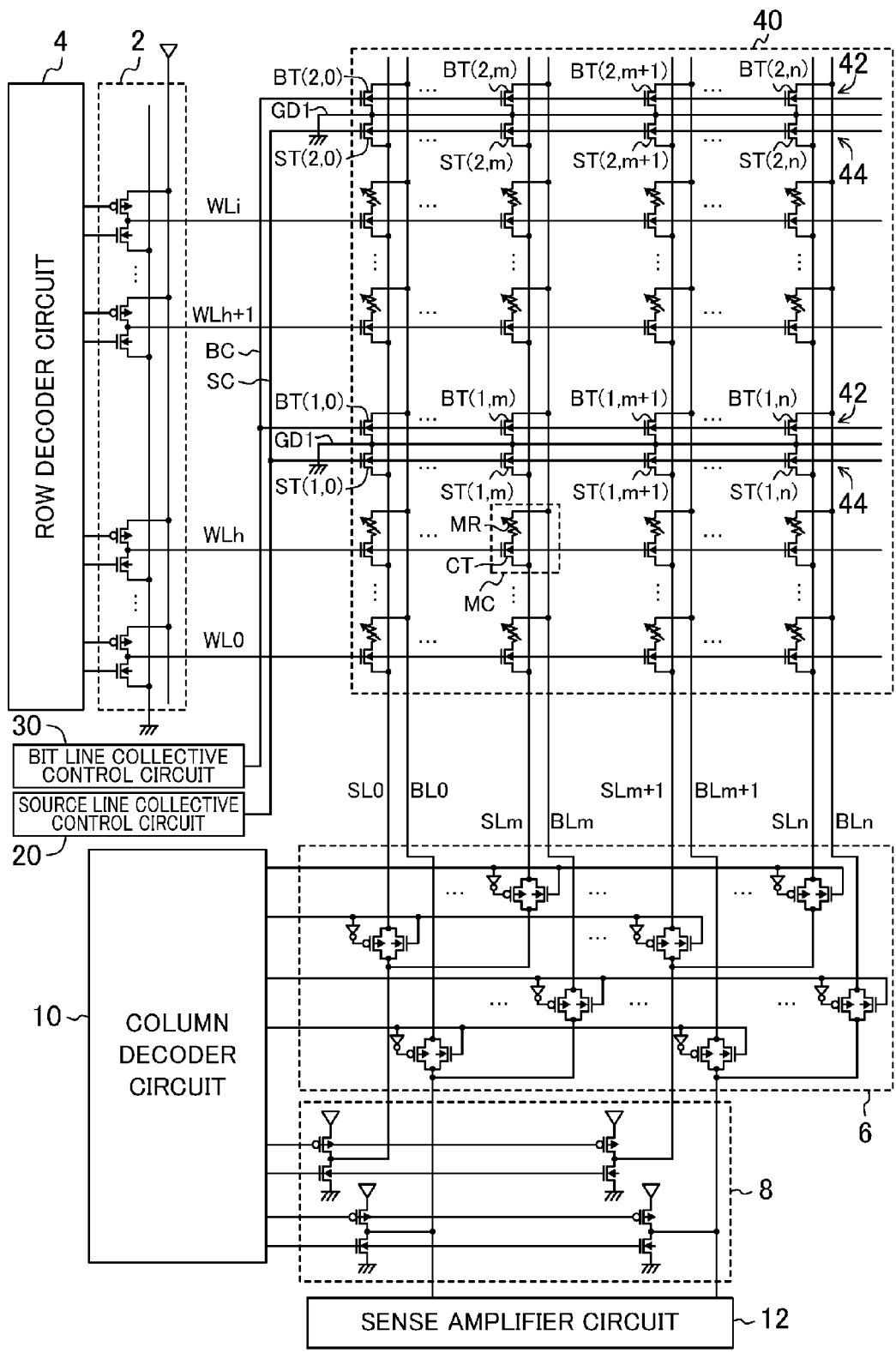
FIG. 5 is a circuit diagram of a semiconductor memory device according to a second embodiment.

FIG. 5 is a circuit diagram of a semiconductor memory device according to a second embodiment. In FIG. 5, the same characters as those in FIG. 2 are used to represent equivalent components, and thus, the explanation thereof will be omitted. In the semiconductor memory device illustrated in FIG. 5, the relationship of connection between each of bit and source lines and memory cells is different from that in the semiconductor memory device in FIG. 2. While, in FIG. 2, the first ground circuits 42 are each below a corresponding one of the second ground circuits 44, first ground circuits 42 are each above a corresponding one of second ground circuits 44 in FIG. 5.

In one of memory cells MC of a memory cell array 40 illustrated in FIG. 5, a source of a cell transistor CT is connected to a source line SLm, and a drain thereof is connected to one end of a variable resistance memory element MR. The other end of the variable resistance memory element MR is connected to a bit line BLm. In this embodiment, source lines SL are first control lines, and bit lines BL are second control lines.

Operations of the semiconductor memory device according to this embodiment are basically similar to those of the semiconductor memory device in FIG. 2. However, in the semiconductor memory device according to this embodiment, when data are read from the memory cell MC, the direction of stress applied to the variable resistance memory element MR is opposite to that in the semiconductor memory device in FIG. 2.

Figure 6:
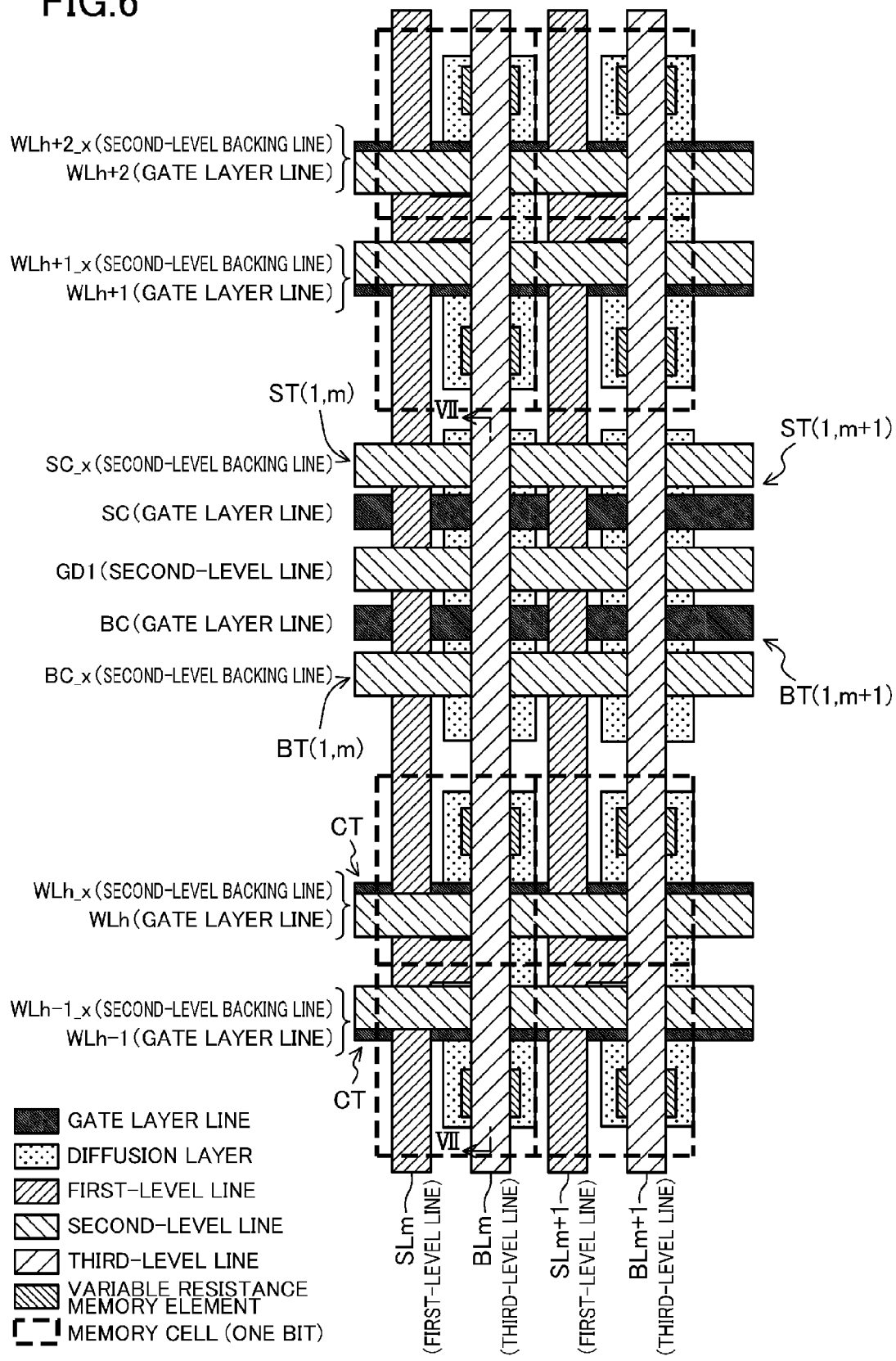
FIG. 6 illustrates a layout of a portion of the semiconductor memory device in FIG. 5.

FIG. 6 illustrates the layout of a region surrounding the bit line BLm and the source line SLm illustrated in FIG. 5. In FIG. 6, the same characters as those in FIG. 3 are used to represent equivalent components, and thus, the explanation thereof will be omitted. As illustrated in FIG. 6, the source line SLm and a source line SLm+1 are first-level lines, and the bit line BLm and a bit line BLm+1 are third-level lines.

Figure 7:
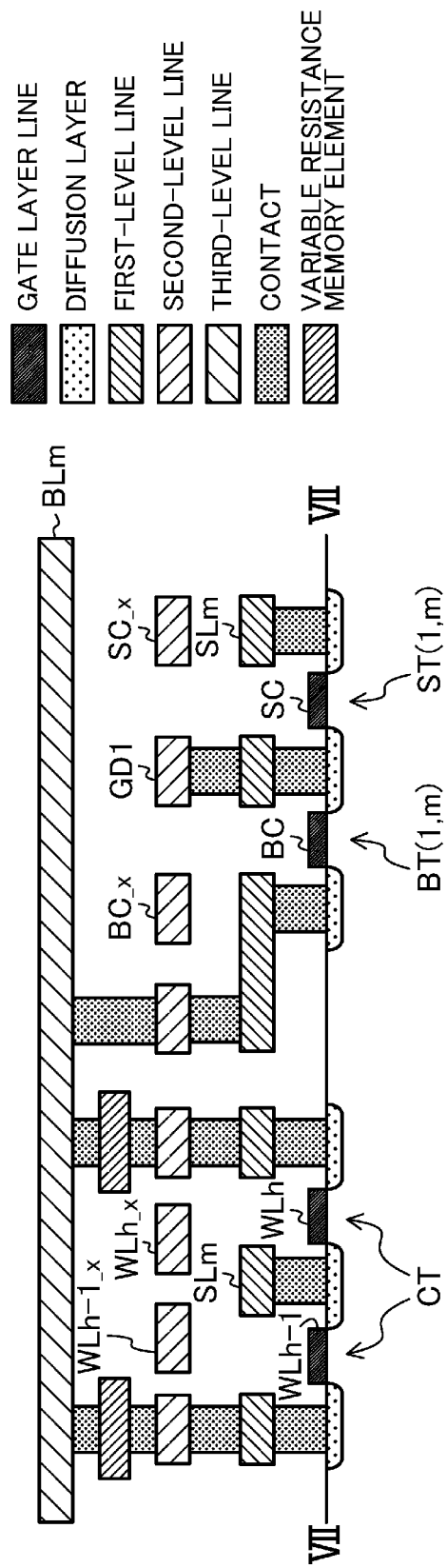
FIG. 7 is a cross-sectional view taken along the line VII-VII in the layout of FIG. 6.

FIG. 7 is a cross-sectional view taken along the line VII-VII in FIG. 6. As illustrated in FIG. 7, an upper terminal of each of variable resistance memory elements is connected through a corresponding one of contacts to the bit line BLm, and a lower terminal thereof is connected through a first-level line, a second-level line, and corresponding ones of the contacts to a drain of a corresponding one of cell transistors CT. A source of each of the cell transistors CT is connected through a corresponding one of the contacts to the source line SLm.

As above, the configuration of the semiconductor memory device of this embodiment can also provide advantages similar to those of the first embodiment.

Third Embodiment

Figure 8:
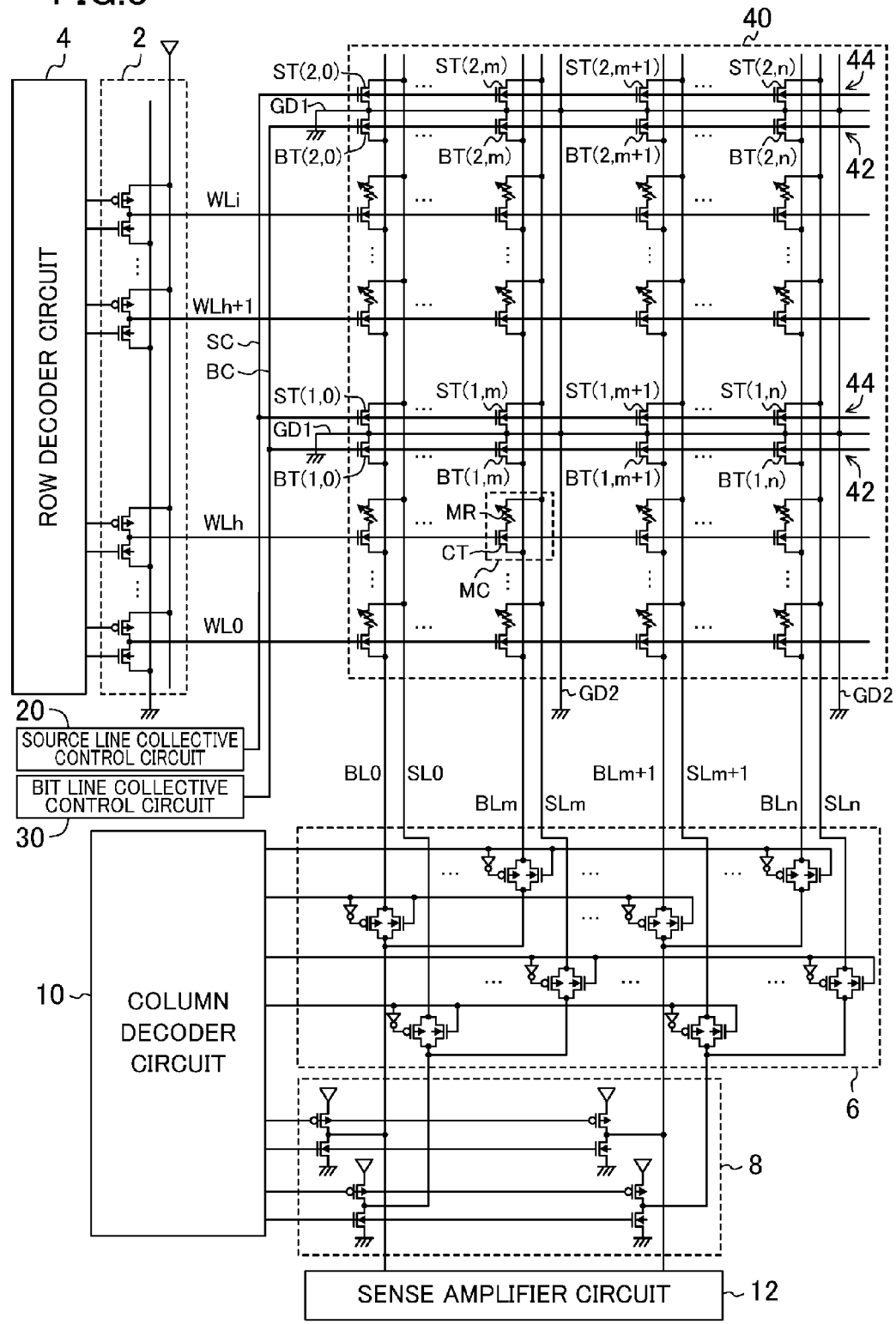
FIG. 8 is a circuit diagram of a semiconductor memory device according to a third embodiment.

FIG. 8 is a circuit diagram of a semiconductor memory device according to a third embodiment. In FIG. 8, the same characters as those in FIG. 2 are used to represent equivalent components, and thus, the explanation thereof will be omitted. Unlike the memory cell array 40 of the semiconductor memory device in FIG. 2, a memory cell array 40 of the semiconductor memory device in FIG. 8 includes ground lines GD2 corresponding to third ground lines.

The ground lines GD2 extend along columns in the memory cell array 40, and intersect ground lines GD1. The ground lines GD1 are each electrically connected to the ground lines GD2 at points of intersection of the ground lines GD1 and GD2. One end of each of the ground lines GD2 is connected to the ground.

Figure 9:
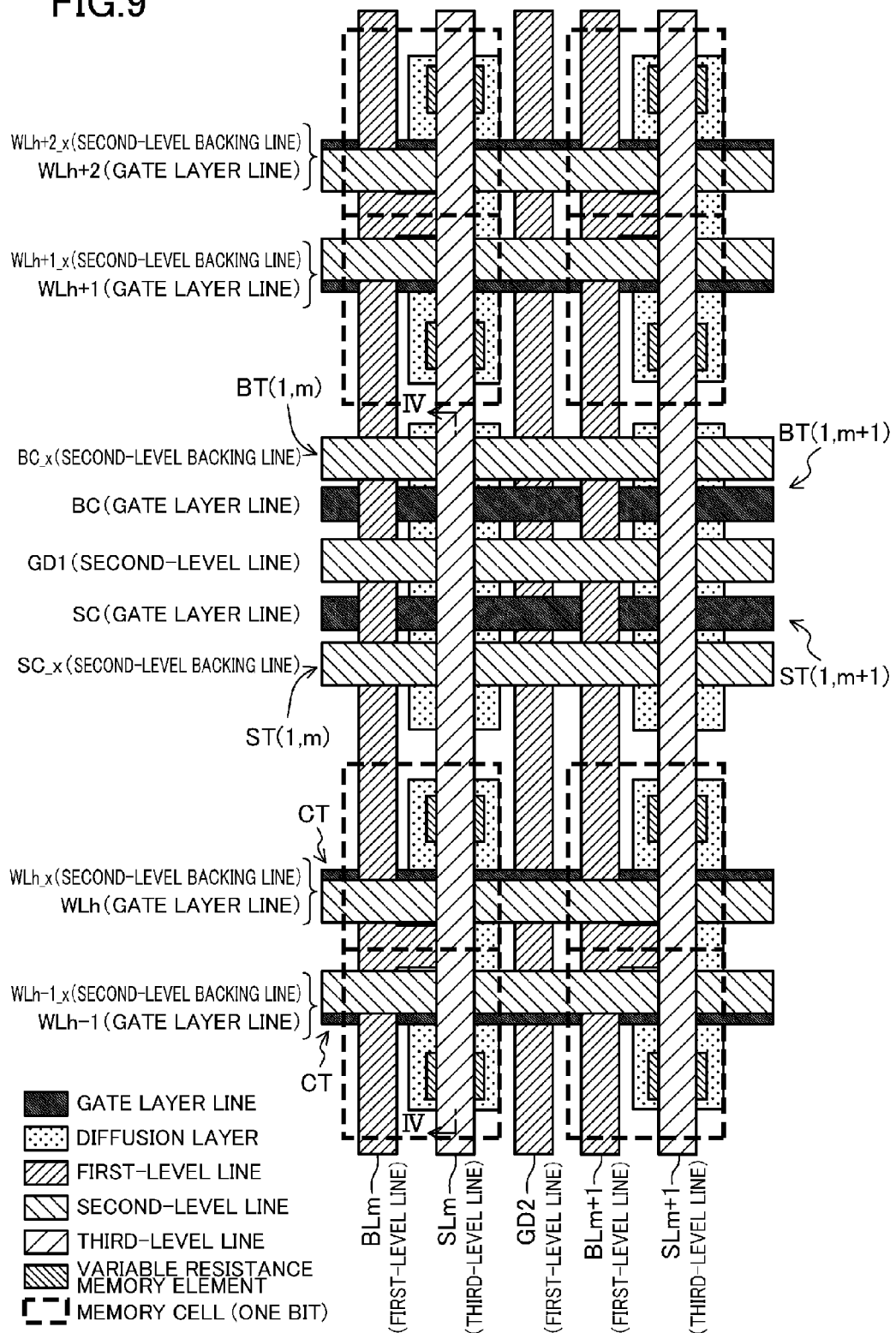
FIG. 9 illustrates a layout of a portion of the semiconductor memory device in FIG. 8.

FIG. 9 illustrates the layout of a region surrounding a bit line BLm and a source line SLm illustrated in FIG. 8. In FIG. 9, the same characters as those in FIG. 3 are used to represent equivalent components, and thus, the explanation thereof will be omitted. Unlike the layout illustrated in FIG. 3, the layout illustrated in FIG. 9 includes one of the ground lines GD2 corresponding to a first-level line between a source line SLm and a bit line BLm+1. A cross-sectional view taken along the line IV-IV in FIG. 9 is similar to the cross-sectional view illustrated in FIG. 4.

As above, in this embodiment, bit lines BL and source lines SL are grounded through the ground lines GD1 and the ground lines GD2 both arranged in a mesh pattern in the memory cell array 40. Such grounding more efficiently allows the potential of each of the grounded bit lines BL and the grounded source lines SL to be closer to the ground potential.

The number of the ground lines GD2 may be one. However, if a plurality of ground lines GD2 are provided, the ground lines GD2 are preferably spaced every predetermined number of the columns in the memory cell array 40 apart. The reason for this is that such placement can provide a uniform layout of features in the memory cell array 40, and allows all of the grounded bit lines BL and the grounded source lines SL to be at substantially the same potential closer to the ground potential.

While, in this embodiment, the ground lines GD2 are placed as first-level lines similarly to the bit lines BL, the ground lines GD2 may be placed as third-level lines similarly to the source lines SL.

Fourth Embodiment

Figure 10:
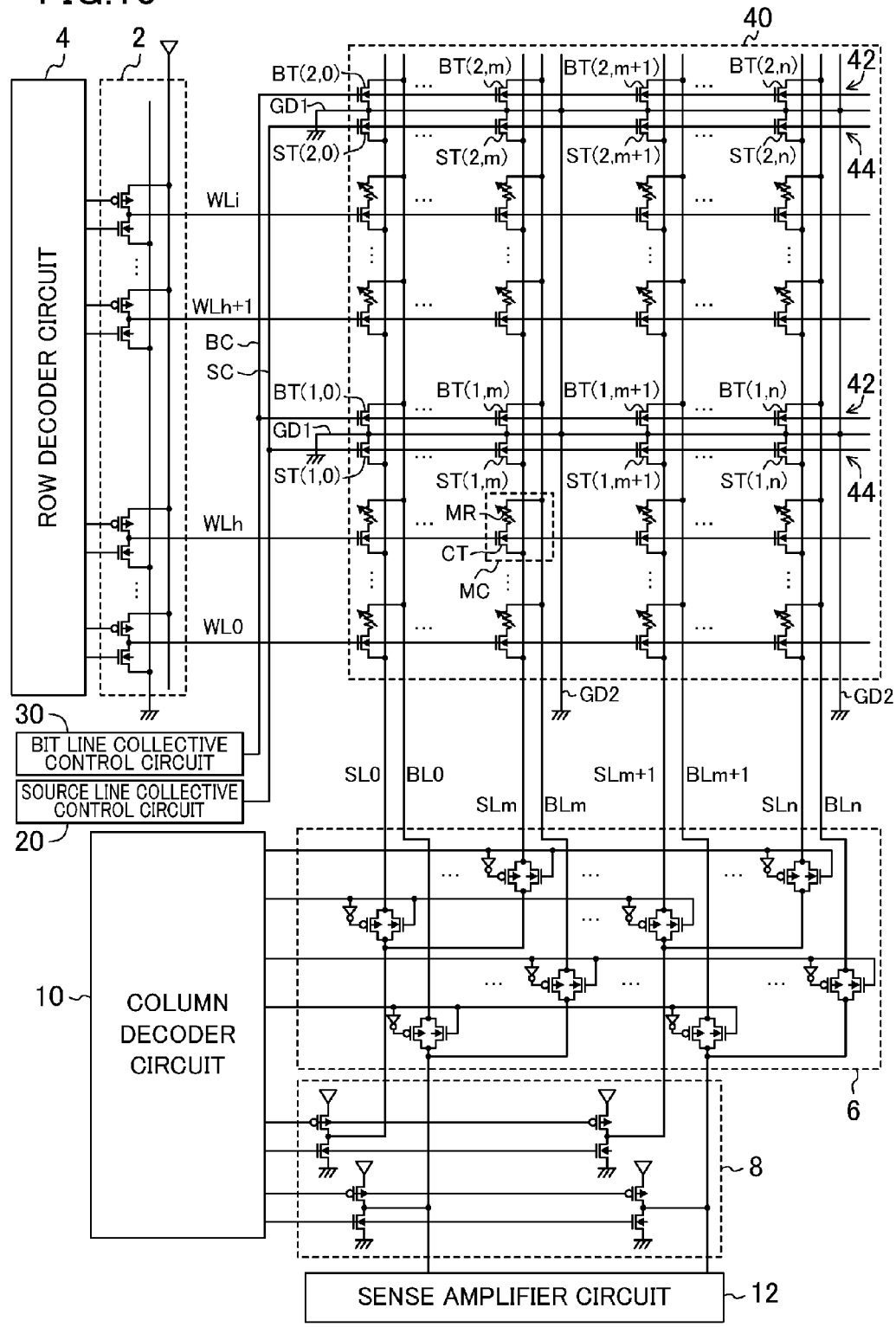
FIG. 10 is a circuit diagram of a semiconductor memory device according to a fourth embodiment.

FIG. 10 is a circuit diagram of a semiconductor memory device according to a fourth embodiment. In FIG. 10, the same characters as those in FIG. 5 are used to represent equivalent components, and thus, the explanation thereof will be omitted. Unlike the memory cell array 40 of the semiconductor memory device in FIG. 5, a memory cell array 40 of the semiconductor memory device in FIG. 10 includes ground lines GD2 that are third ground lines.

The ground lines GD2 extend along columns in the memory cell array 40, and intersect ground lines GD1. The ground lines GD1 are each electrically connected to the ground lines GD2 at points of intersection of the ground lines GD1 and GD2. One end of each of the ground lines GD2 is connected to the ground.

Figure 11:
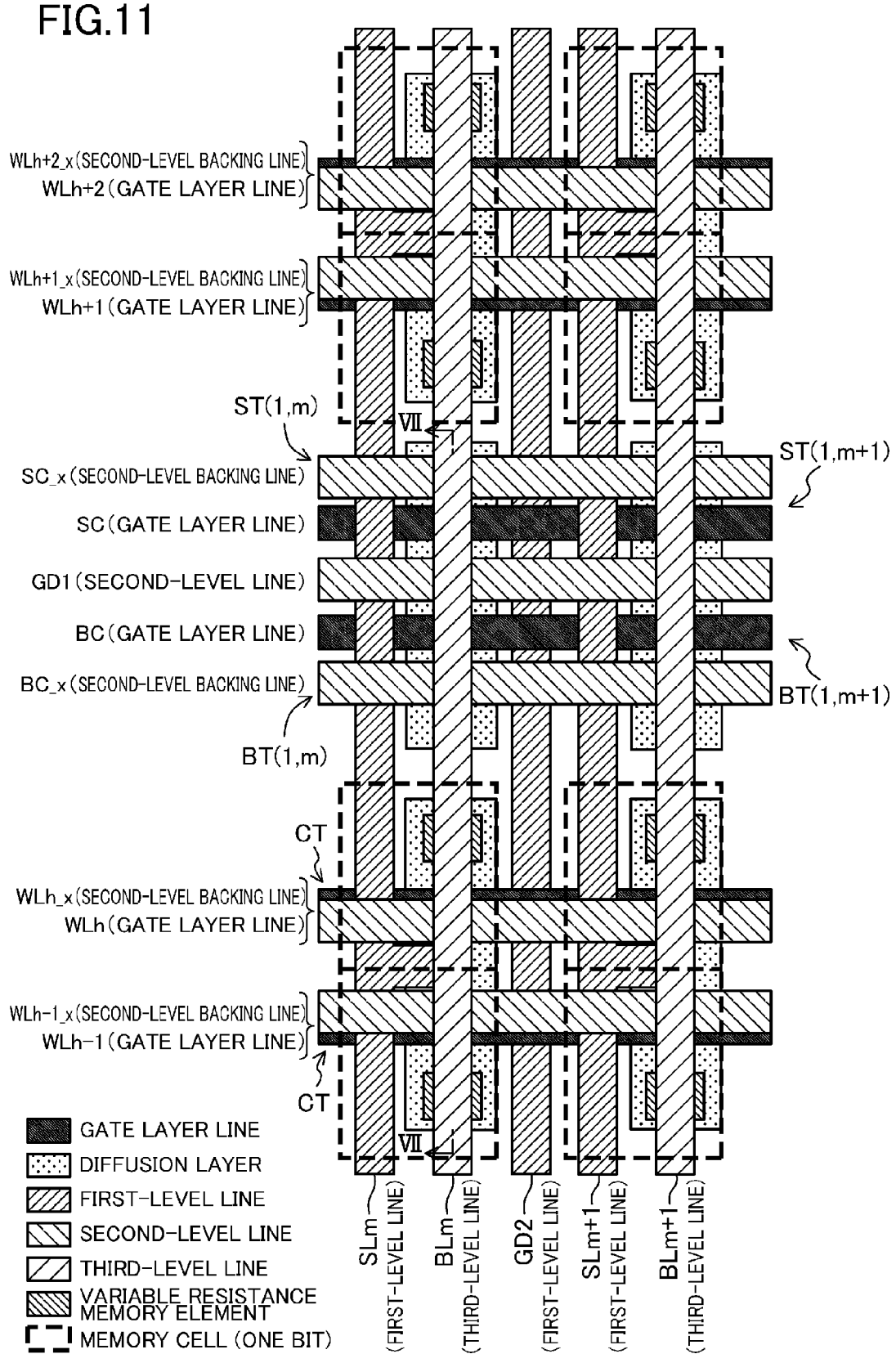
FIG. 11 illustrates a layout of a portion of the semiconductor memory device in FIG. 10.

FIG. 11 illustrates the layout of a region surrounding a bit line BLm and a source line SLm illustrated in FIG. 10. In FIG. 11, the same characters as those in FIG. 6 are used to represent equivalent components, and thus, the explanation thereof will be omitted. Unlike the layout illustrated in FIG. 6, the layout illustrated in FIG. 11 includes one of the ground lines GD2 corresponding to a first-level line between a bit line BLm and a source line SLm+1. A cross-sectional view taken along the line VII-VII in FIG. 11 is similar to the cross-sectional view illustrated in FIG. 7.

Such a configuration of the semiconductor memory device can also provide advantages similar to those of the third embodiment.

The number of the ground lines GD2 may be one. However, if a plurality of ground lines GD2 are provided, the ground lines GD2 are preferably spaced every predetermined number of the columns in the memory cell array 40 apart. The reason for this is that such placement can provide a uniform layout of features in the memory cell array 40, and allows all of the grounded bit lines BL and the grounded source lines SL to be at substantially the same potential closer to the ground potential.

While, in this embodiment, the ground lines GD2 are placed as first-level lines similarly to the source lines SL, the ground lines GD2 may be placed as third-level lines similarly to the bit lines BL.

Fifth Embodiment

Figure 12:
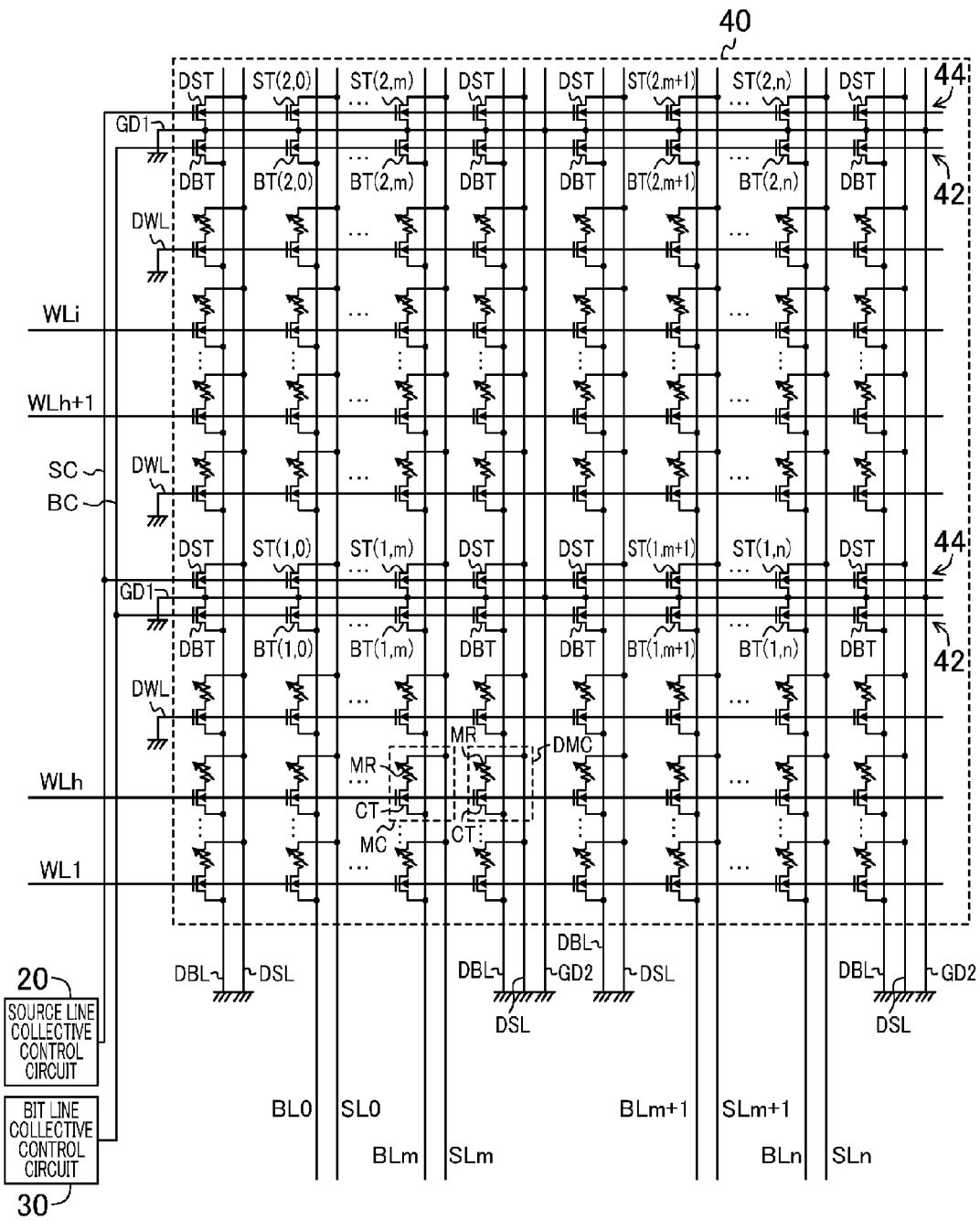
FIG. 12 is a circuit diagram of a semiconductor memory device according to a fifth embodiment.

FIG. 12 is a circuit diagram of a semiconductor memory device according to a fifth embodiment. FIGS. 8 and 12 are different from each other only in the configuration of circuits in a memory cell array 40, and thus, in FIG. 12, a word driver circuit 2, a row decoder circuit 4, a column gate circuit 6, a write driver circuit 8, a column decoder circuit 10, and a sense amplifier circuit 12 are omitted.

The memory cell array 40 of the semiconductor memory device in FIG. 12 includes a plurality of dummy memory cells DMC, a plurality of dummy bit lines DBL, a plurality of dummy source lines DSL, a plurality of dummy word lines DWL, a plurality of dummy transistors DBT, and a plurality of dummy transistors DST.

Memory cells on, e.g., the leftmost column of the memory cell array 40 are dummy memory cells DMC. Memory cells each including a cell transistor having a gate connected to one of the dummy word lines DWL, and memory cells each adjacent to one of the ground lines GD2 are also dummy memory cells DMC. The dummy memory cells DMC each have a configuration similar to that of each of the memory cells MC, and each include a variable resistance memory element MR, and a cell transistor CT connected to the variable resistance memory element MR.

Bit lines and source lines connected to the dummy memory cells DMC are dummy bit lines DBL and dummy source lines DSL, respectively. Thus, bit lines and source lines adjacent to the ground lines GD2 may be some of the dummy bit lines DBL and some of the dummy source lines DSL, respectively. One end of each of the dummy bit lines DBL and the dummy source lines DSL is connected to the ground.

First ground circuits 42 each include, for example, four dummy transistors DBT. Two of the dummy transistors DBT are provided near both ends of the first ground circuit 42, and the other dummy transistors DBT are adjacent to one of the ground lines GD2. A drain of each of the dummy transistors DBT is connected to a corresponding one of the dummy bit lines DBL, and sources of the dummy transistors DBT are all connected to a corresponding one of the ground lines GD1. Gates of the dummy transistors DBT are connected to a bit line collective control line BC.

Second ground circuits 44 each include, for example, four dummy transistors DST. Two of the dummy transistors DST are provided near both ends of the second ground circuit 44, and the other dummy transistors DST are adjacent to one of the ground lines GD2. A drain of each of the dummy transistors DST is connected to a corresponding one of the dummy source lines DSL, and sources of the dummy transistors DST are all connected to the corresponding one of the ground lines GD1. Gates of the dummy transistors DST are connected to a source line collective control line SC.

Word lines adjacent to pairs of the first and second ground circuits 42 and 44 are dummy word lines DWL. Some of a plurality of word lines adjacent to at least one of the bit line collective control line BC, the source line collective control line SC, or the ground lines GD1 may serve as dummy word lines DWL. For example, a ground potential is fed, as a potential that allows cell transistors each having a gate connected to a corresponding one of the dummy word lines DWL to be in a non-conductive state, to the dummy word lines DWL.

Typically, the characteristics of memory cells corresponding to, for example, the leftmost and rightmost columns of the memory cell array 40 tends to be degraded as compared with the characteristics of memory cells located in a central portion of the memory cell array 40. Such memory cells with degraded characteristics may adversely affect, for example, operations of normal memory cells.

To address this problem, in this embodiment, the leftmost and rightmost memory cells in the memory cell array 40 are used as the dummy memory cells DMC without being used as memory cells. Thus, the preferable characteristics of the memory cells MC except the dummy memory cells DMC can be kept.

The transistors BT in the first ground circuits 42, the transistors ST in the second ground circuit 44, and the cell transistors CT have the same shape. This can provide a uniform layout of features in the memory cell array 40. Thus, the provision of the first and second ground circuits 42 and 44 is less likely to adversely affect the characteristics of memory cells near the first and second ground circuits 42 and 44. However, when degradation in the characteristics of these memory cells is problematic, the memory cells adjacent to the first and second ground circuits 42 and 44 along the rows may serve as dummy memory cells DMC.

Furthermore, in order to further reduce the influence of the provision of the ground lines GD2 on the characteristics of the memory cells, the memory cells adjacent to the ground lines GD2 along the columns may serve as dummy memory cells DMC.

As above, according to this embodiment, the advantages of the above embodiments can be obtained, and degradation in the characteristics of normal ones of the memory cells can be reduced to a minimum.

Sixth Embodiment

Figure 13:
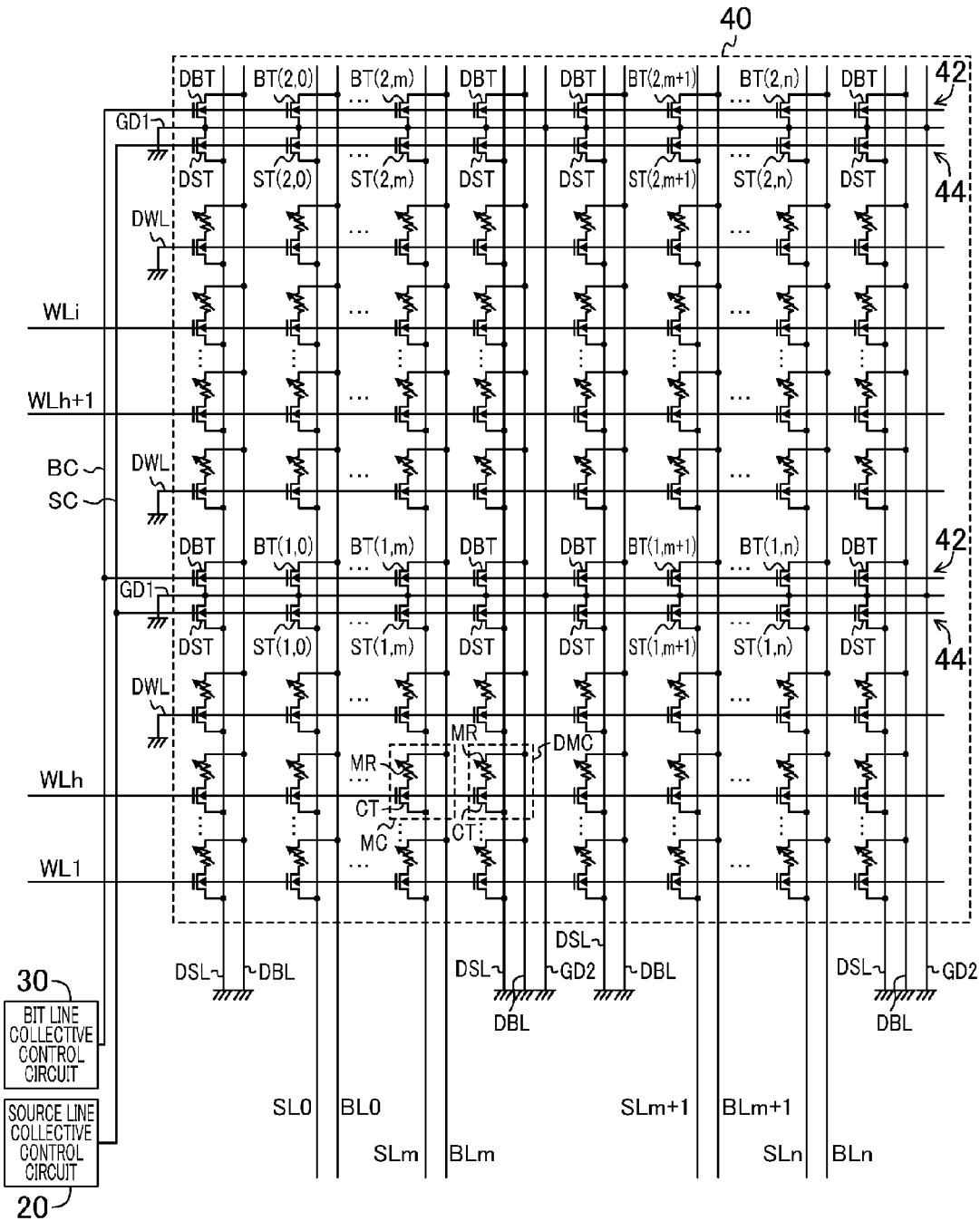
FIG. 13 is a circuit diagram of a semiconductor memory device according to a sixth embodiment.

FIG. 13 is a circuit diagram of a semiconductor memory device according to a sixth embodiment. In FIG. 13, the same characters as those in FIG. 12 are used to represent equivalent components, and thus, the explanation thereof will be omitted. The difference between the semiconductor memory device in FIG. 13 and the semiconductor memory device in FIG. 12 will be described hereinafter.

While the bit lines BL of the semiconductor memory device in FIG. 12 are each located to the left of a corresponding one of the source lines SL thereof, bit lines BL of the semiconductor memory device in FIG. 13 are located to the right of a corresponding one of sources lines SL thereof. While the dummy bit lines DBL of the semiconductor memory device in FIG. 12 are each located to the left of a corresponding one of the dummy source lines DSL thereof, dummy bit lines DBL of the semiconductor memory device in FIG. 13 are also located to the right of a corresponding one of dummy sources lines DSL thereof. Thus, while the first ground circuits 42 of the semiconductor memory device in FIG. 12 are each below a corresponding one of the second ground circuits 44 thereof, first ground circuits 42 of the semiconductor memory device in FIG. 13 are each above a corresponding one of the second ground circuits 44 thereof.

Such a configuration of the semiconductor memory device can also provide advantages similar to those of the fifth embodiment.

In each of the embodiments, lines in the memory cell array 40 are each placed at an optional one of a plurality of levels.

Other Example Configurations

In each of the embodiments, a case where the bit lines BL are parallel to the source lines SL was described. However, for example, either the bit lines BL or the source lines SL may extend along the columns, and the other lines may extend along the rows.

Figure 14:
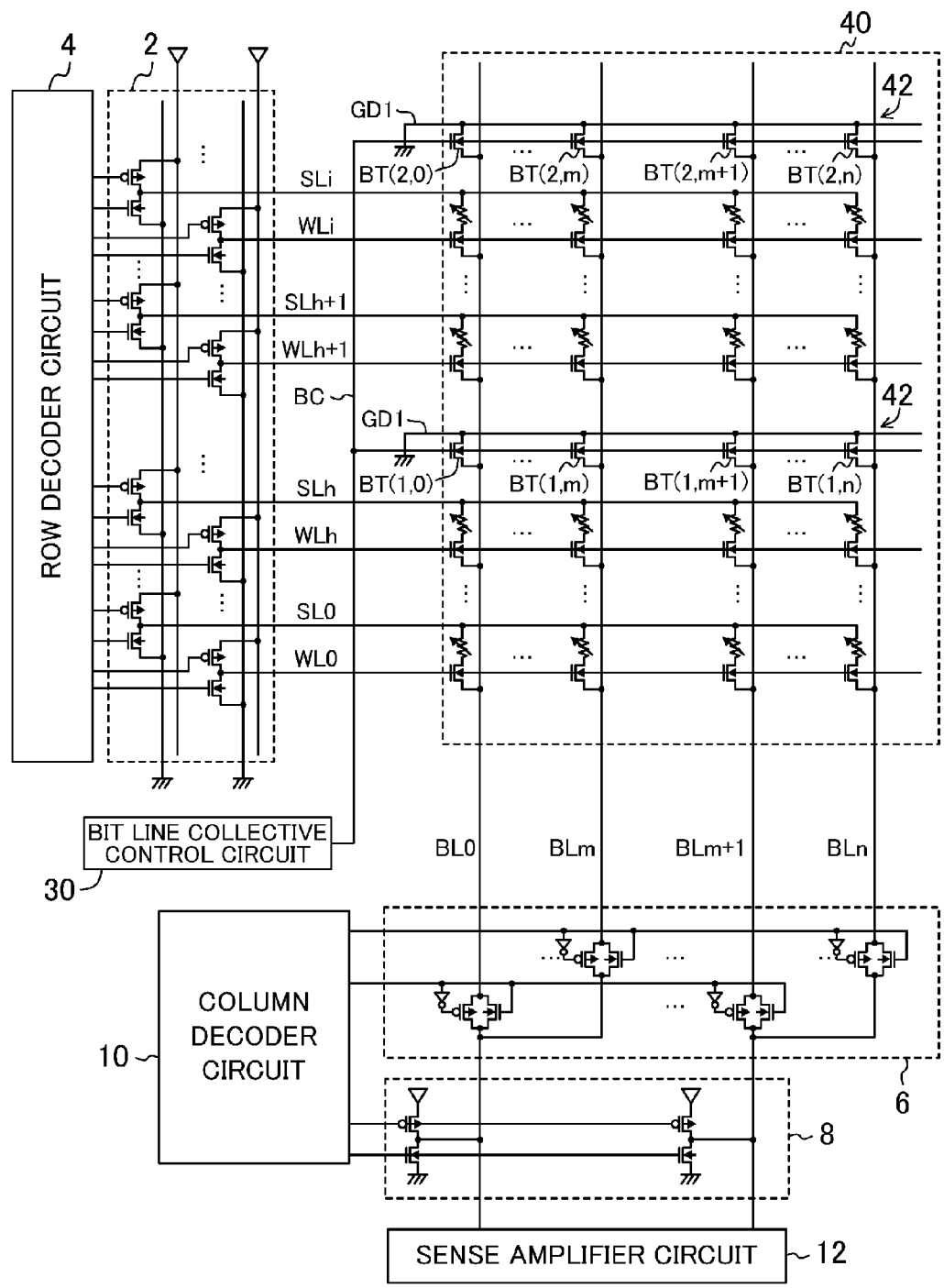
FIG. 14 is a circuit diagram illustrating another example configuration of a semiconductor memory device.

FIG. 14 illustrates an example configuration of a semiconductor memory device including bit lines BL, and source lines SL orthogonal to the bit lines BL. In this case, a word driver circuit 2 includes a circuit configured to control the voltage applied to the source lines SL. Thus, a column gate circuit 6 and a write driver circuit 8 do not need to each include a circuit configured to control the source lines SL.

Although FIG. 14 illustrates the example configuration of the semiconductor memory device including first ground circuits 42, the semiconductor memory device may include second ground circuits. In this case, the semiconductor memory device includes a source line collective control circuit, and the second ground circuits each include a plurality of transistors being in a one-to-one correspondence with the source lines SL and aligned along a corresponding one of columns. A drain of each of the transistors may be connected to a corresponding one of the source lines SL, and a ground line connected to all of sources of the transistors may extend along the columns. Furthermore, gates of the transistors and a source line collective control circuit may be connected together through a source line collective control line. The lines can be placed at the same levels as those in each of FIGS. 3 and 4.

The semiconductor memory device in FIG. 14 may further include the ground lines GD2 illustrated in FIG. 8. In this case, the ground lines GD2 may be placed at the same level as the bit lines BL to extend along the columns. If second ground circuits are provided, another ground line GD2 may be placed at the same level as the source lines SL to extend along rows.

The semiconductor memory device in FIG. 14 may further include the dummy bit lines DBL, the dummy source lines DSL, the dummy word lines DWL, the dummy transistors DBT and DST, and the dummy memory cells DMC illustrated in FIG. 12. In this case, memory cells corresponding to the leftmost and rightmost columns in a memory cell array 40 serve as dummy memory cells DMC.

Word lines and source lines adjacent to the first ground circuits 42 may serve as dummy word lines DWL and dummy source lines DSL, respectively. If second ground circuits are provided, bit lines adjacent to the second ground circuits may serve as dummy bit lines DBL.

Furthermore, dummy transistors DBT may be placed, for example, near both ends of each of the first ground circuits 42, and dummy transistors DST may be placed, for example, near both ends of each of the second ground circuits.

Figure 15:
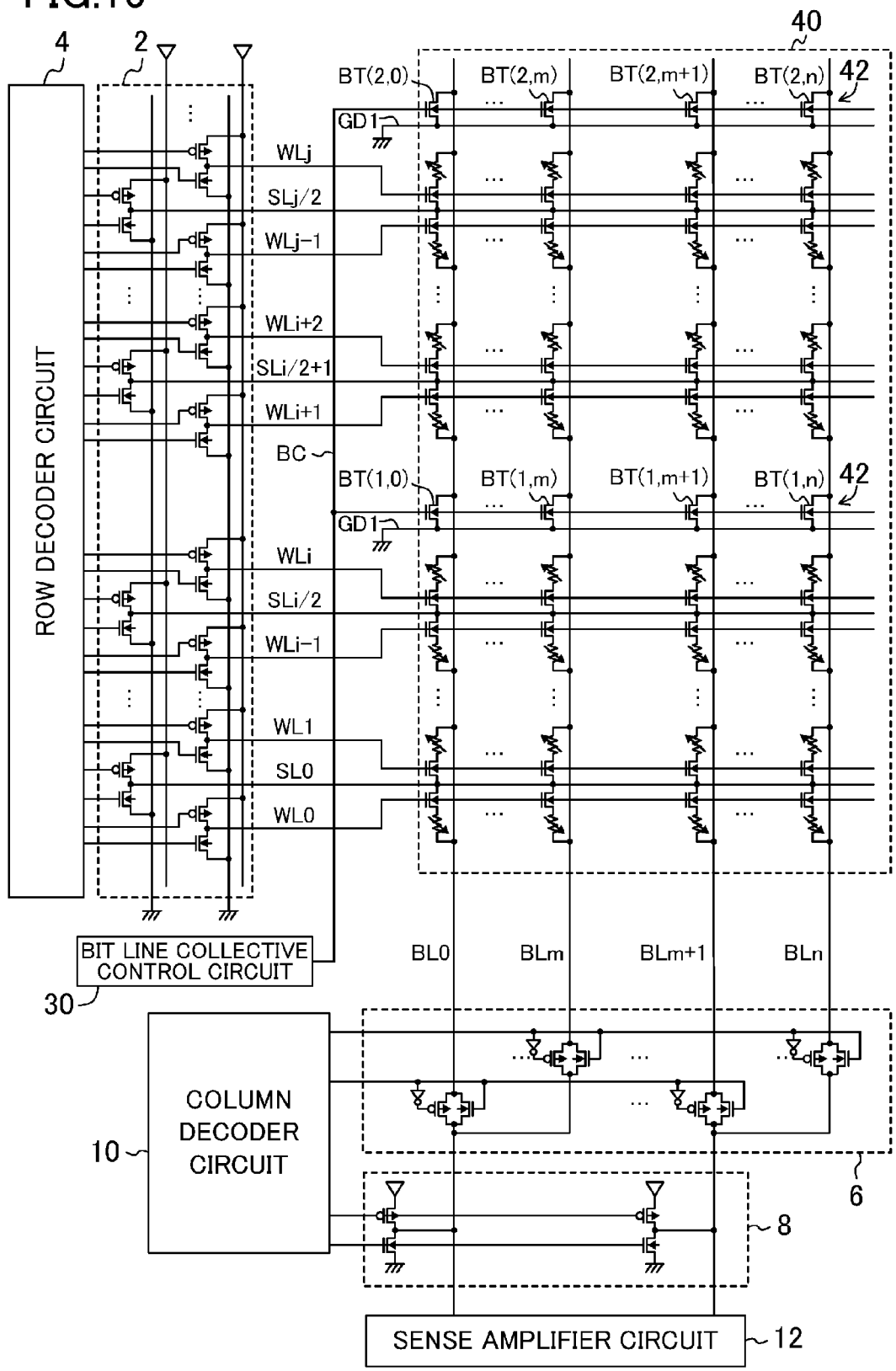
FIG. 15 is a circuit diagram of a variation of the semiconductor memory device in FIG. 14.
Figure 17A:
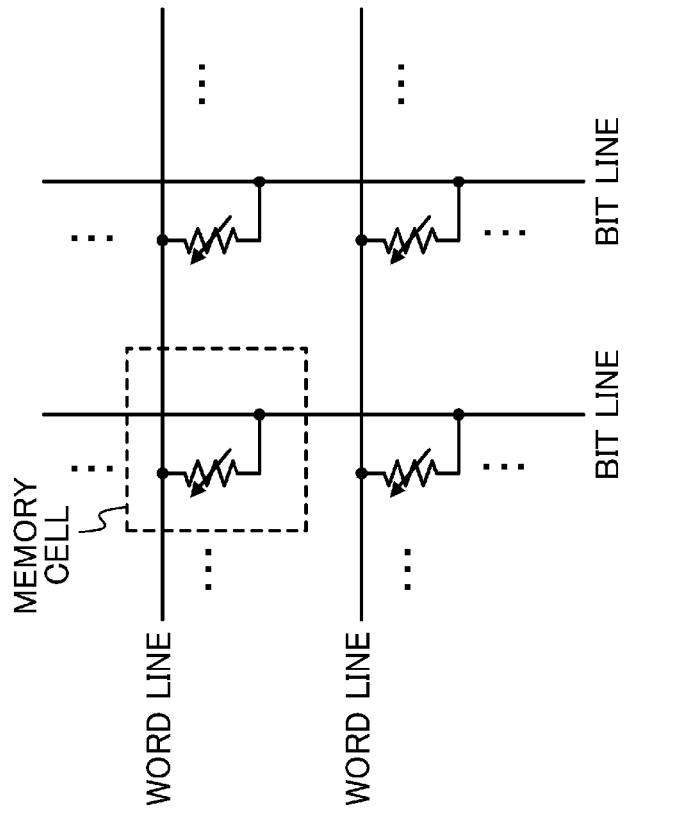
FIGS. 17A and 17B illustrate example memory cells each including a variable resistance memory element.
Figure 17B:
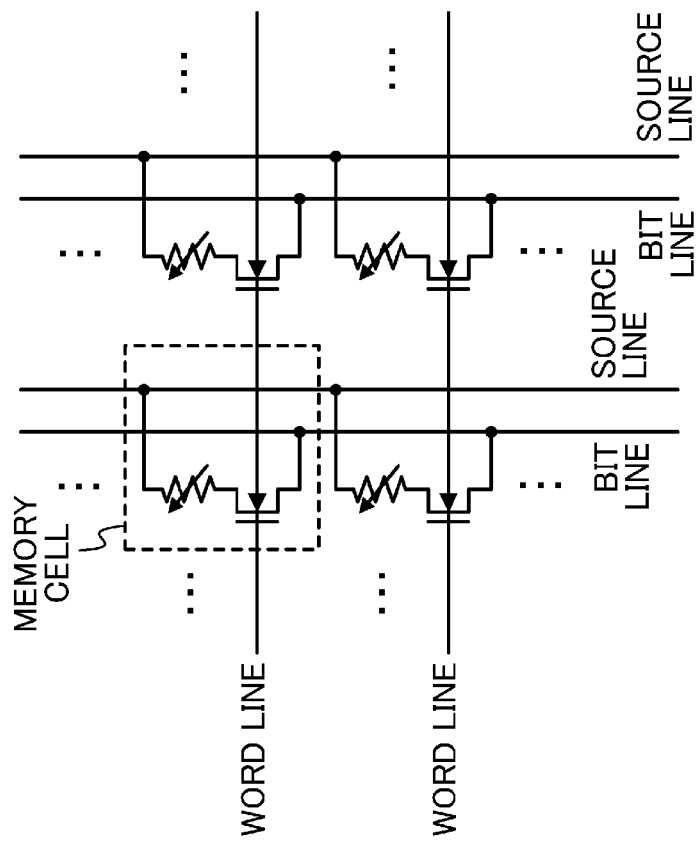
Figure 18A:
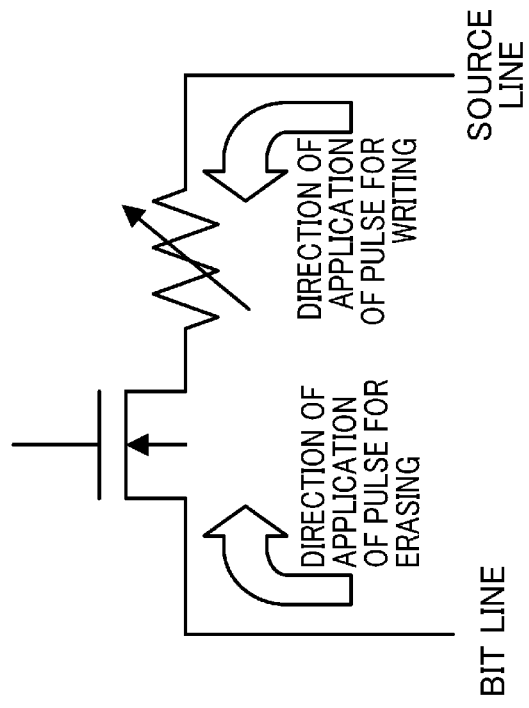
FIGS. 18A and 18B are diagrams for explaining unipolar and bipolar memory cells.
Figure 18B:
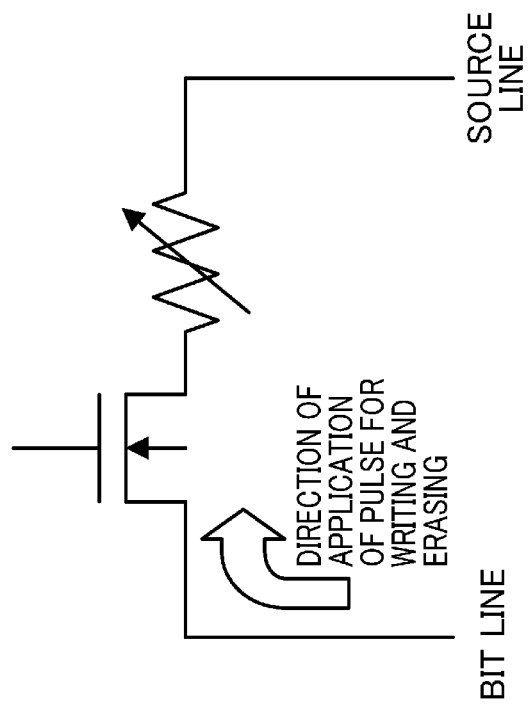

Similarly to the semiconductor memory device illustrated in FIG. 15, two of the memory cells adjacent to each other along the columns may share a single source line SL.

In each of the embodiments, a case where the memory cell array 40 has a three-level interconnection structure was described. However, the memory cell array 40 may have a three-or-more-level interconnection structure. For example, as illustrated in FIG. 16, the memory cell array 40 may have a four-level interconnection structure.

FIG. 16 is a cross-sectional view in which the memory cell array 40 illustrated in FIG. 4 has a four-level interconnection structure. In FIG. 16, the same characters as those in FIG. 4 are used to represent equivalent components, and thus, the explanation thereof will be omitted.

As illustrated in FIG. 16, when the memory cell array 40 has a four-level interconnection structure, variable resistance memory elements are each placed, for example, between a third-level line and a fourth-level line.

When, as such, the memory cell array 40 has a four-level interconnection structure, the size of each of memory cells tends to be smaller than when the memory cell array 40 has a three-level interconnection structure.

In each of the embodiments, a semiconductor memory device including a variable resistance memory element as a memory element was described. However, the semiconductor memory device may include another memory element. The semiconductor memory device may include, for example, a magnetoresistive random access memory (MRAM) or a phase change random access memory (PRAM).

What is claimed is:

1. A semiconductor memory device comprising:
   a memory cell array including a plurality of memory cells that are arranged in a matrix;
   a plurality of word lines;
   a plurality of first control lines;
   a plurality of second control lines;
   at least one first ground circuit configured to ground the plurality of first control lines together in accordance with a first signal; and
   at least one second ground circuit configured to ground the plurality of second control lines together in accordance with a second signal, wherein:
   each of the plurality of memory cells includes a memory element and a cell transistor both connected between a corresponding one of the plurality of first control lines and a corresponding one of the plurality of second control lines,
   the plurality of word lines are provided in a one-to-one correspondence with rows, each of the plurality of word lines being connected to gates of cell transistors in the plurality of memory cells located on a corresponding one of the rows, and extending along the rows,
   the at least one first ground circuit includes:
   a plurality of first transistors provided in a one-to-one correspondence with the plurality of first control lines, each of the plurality of first transistors including a drain connected to a corresponding one of the plurality of first control lines;
   a first ground line configured to ground sources of the plurality of first transistors together; and
   a first signal line connected to gates of the plurality of first transistors to feed the first signal to the gates,
   the at least one second ground circuit includes:
   a plurality of second transistors provided in a one-to-one correspondence with the plurality of second control lines, each of the plurality of second transistors including a drain connected to a corresponding one of the plurality of second control lines;
   a second ground line configured to ground sources of the plurality of second transistors together; and
   a second signal line connected to gates of the plurality of second transistors to feed the second signal to the gates,
   the plurality of first control lines are source lines being provided in a one-to-one correspondence with columns of the memory cell array, and extending along the columns, and
   the plurality of second control lines are bit lines being provided in a one-to-one correspondence with the columns of the memory cell array, and extending along the columns.

2. The semiconductor memory device of claim 1, wherein:
   the plurality of first transistors are aligned along one of the rows of the memory cell array,
   the plurality of second transistors are aligned along the one of the rows, and
   the first and second ground lines and the first and second signal lines are parallel along the rows.

3. The semiconductor memory device of claim 1, wherein a gate width and a gate length of each of the plurality of first and second transistors are equal to a gate width and a gate length, respectively, of the cell transistor included in each of the plurality of memory cells.

4. The semiconductor memory device of claim 1, further comprising:
   a first-signal-line-backing line placed above a level at which the first signal line is placed;
   a second-signal-line-backing line placed above a level at which the second signal line is placed; and
   backing lines for the plurality of word lines, wherein:
   the first and second signal lines are made of a material identical with a material of the gate of the cell transistor included in each of the plurality of memory cells, and
   the first-signal-line-backing line, the second-signal-line-backing line, and the backing lines for the plurality of word lines are placed at an identical level.

5. The semiconductor memory device of claim 1, wherein the first signal allows the plurality of first transistors to be conductive before a voltage is applied to any one of the plurality of second control lines.

6. The semiconductor memory device of claim 1, wherein the second signal allows the plurality of second transistors to be conductive before a voltage is applied to any one of the plurality of first control lines.

7. The semiconductor memory device of claim 1, wherein when any one of the plurality of first control lines is discharged, the first signal allows the plurality of first transistors to be conductive.

8. The semiconductor memory device of claim 1, wherein when any one of the plurality of second control lines is discharged, the second signal allows the plurality of second transistors to be conductive.

9. The semiconductor memory device of claim 1, wherein the memory element is a variable resistance memory element.

10. The semiconductor memory device of claim 2, wherein the first and second ground lines are a common ground line.

11. The semiconductor memory device of claim 2, wherein:
the at least one first ground circuit includes a plurality of first ground circuits,
the at least one second ground circuit includes a plurality of second ground circuits, and
groups each containing one of the first ground circuits including two of the plurality of first transistors, and one of the second ground circuits including two of the plurality of second transistors close to the two of the plurality of first transistors along the columns of the memory cell array are spaced apart every predetermined number of the rows of the memory cell array.

12. The semiconductor memory device of claim 10, wherein
the memory cell array includes at least one third ground line that extends along the columns to intersect the common ground line, is connected to the common ground line at a point of intersection of the at least one third ground line and the common ground line, and has one grounded end.

13. The semiconductor memory device of claim 10, wherein
a voltage is fed to one of the plurality of word lines adjacent to at least one of the common ground line, the first signal line, or the second signal line to allow the cell transistor having a gate connected to the one of the plurality of word lines to be in a non-conductive state.

14. The semiconductor memory device of claim 12, wherein
one of pairs of the plurality of first control lines and the plurality of second control lines adjacent to the at least one third ground line is grounded.

15. The semiconductor memory device of claim 12, wherein
the at least one third ground line is placed at a level identical with a level at which either the plurality of first control lines or the plurality of second control lines are placed.

16. The semiconductor memory device of claim 12, wherein
the at least one third ground line includes a plurality of third ground lines, and
the plurality of third ground lines are spaced every predetermined number of the columns of the memory cell array apart.

17. A semiconductor memory device comprising:
a memory cell array including a plurality of memory cells that are arranged in a matrix;
a plurality of word lines;
a plurality of first control lines;
a plurality of second control lines;
at least one first ground circuit configured to ground the plurality of first control lines together in accordance with a first signal; and
at least one second ground circuit configured to ground the plurality of second control lines together in accordance with a second signal, wherein:
each of the plurality of memory cells includes a memory element and a cell transistor both connected between a corresponding one of the plurality of first control lines and a corresponding one of the plurality of second control lines,
the plurality of word lines are provided in a one-to-one correspondence with rows, each of the plurality of word lines being connected to gates of cell transistors in the plurality of memory cells located on a corresponding one of the rows, and extending along the rows,
the at least one first ground circuit includes:
a plurality of first transistors provided in a one-to-one correspondence with the plurality of first control lines, each of the plurality of first transistors including a drain connected to a corresponding one of the plurality of first control lines;
a first ground line configured to ground sources of the plurality of first transistors together; and
a first signal line connected to gates of the plurality of first transistors to feed the first signal to the gates,
the at least one second ground circuit includes:
a plurality of second transistors provided in a one-to-one correspondence with the plurality of second control lines, each of the plurality of second transistors including a drain connected to a corresponding one of the plurality of second control lines;
a second ground line configured to ground sources of the plurality of second transistors together; and
a second signal line connected to gates of the plurality of second transistors to feed the second signal to the gates,
the plurality of first control lines are bit lines being provided in a one-to-one correspondence with columns of the memory cell array, and extending along the columns,
the plurality of second control lines are source lines being provided in a one-to-one correspondence with the rows of the memory cell array, and extending along the rows,
the first ground line and the first signal line are parallel to each other along the rows, and
the plurality of first transistors are aligned along one of the rows.

* * * * *